US010026225B2

(12) United States Patent
Grip

(10) Patent No.: US 10,026,225 B2
(45) Date of Patent: Jul. 17, 2018

(54) TWO-DIMENSIONAL MODEL OF TRIANGULAR SECTORS FOR USE IN GENERATING A MESH FOR FINITE ELEMENT ANALYSIS

(71) Applicant: The Boeing Company, Chicago, IL (US)

(72) Inventor: Robert Erik Grip, Rancho Palos Verdes, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/641,172

(22) Filed: Jul. 3, 2017

(65) Prior Publication Data

US 2017/0309068 A1   Oct. 26, 2017

Related U.S. Application Data

(63) Continuation of application No. 14/189,087, filed on Feb. 25, 2014, now Pat. No. 9,697,645.

(51) Int. Cl.
*G06T 17/20* (2006.01)
*G06F 17/50* (2006.01)

(52) U.S. Cl.
CPC ........ *G06T 17/20* (2013.01); *G06F 17/5018* (2013.01)

(58) Field of Classification Search
None
See application file for complete search history.

(56) References Cited

U.S. PATENT DOCUMENTS

| 9,697,645 | B2 | 7/2017 | Grip | |
|---|---|---|---|---|
| 2006/0080069 | A1* | 4/2006 | Fujimoto | G06F 17/5018 703/2 |
| 2009/0324041 | A1* | 12/2009 | Narayanan | G06K 9/00986 382/131 |
| 2012/0226482 | A1 | 9/2012 | Wu | |

(Continued)

OTHER PUBLICATIONS

Ho-Le, "Finite element mesh generation methods: a review and classification," Butterworth & Co. (Publishers) Ltd., Computer-Aided Design, Jan./Feb. 1988, vol. 20, No. 1, pp. 27-38.

(Continued)

*Primary Examiner* — James A Thompson
(74) *Attorney, Agent, or Firm* — Yee & Associates, P.C.

(57) ABSTRACT

A method and apparatus for analyzing a joint. The apparatus comprises a graph generator and a model generator. The graph generator forms a first graph based on a plurality of points within a region. The plurality of points represent a plurality of locations relative to a structure for a plurality of fastener devices configured to be installed in the structure to form a joint. The graph generator is configured to identify primary points and secondary points based on the first graph. The graph generator is further configured to form a second graph using the primary points, the secondary points, and the first graph. The model generator is configured to generate a two-dimensional model comprised of triangular sectors using vertices of the second graph. The two-dimensional model is configured for use in forming a mesh for use in performing finite element analysis for the joint.

12 Claims, 34 Drawing Sheets

(56) References Cited

U.S. PATENT DOCUMENTS

2015/0015580 A1* 1/2015 Kim ...................... G06T 17/20
                                                    345/423

OTHER PUBLICATIONS

Schneiders, "Algorithms for Quadrilateral and Hexahedral Mesh Generation," VKI Lecture Series on Computational Fluid Dynamic, Mar. 2000, VKI-LS 2000-4, 56 pages.

International Search Report and Written Opinion, dated Jul. 21, 2015, regarding Application No. PCT/US2015/011756, 11 pages.

Atas et al., "A qualitative comparison of stresses at aircraft bolted joint holes under initial clamping force," Procedia Engineering, vol. 10, Dec. 2011, pp. 3-8.

Oskouei et al., "A finite element stress analysis of aircraft bolted joints loaded in tension," The Aeronautical Journal, vol. 114, No. 1156, Jun. 2010, 6 pages.

International Search Report and Written Opinion, dated Aug. 30, 2016, regarding Application No. PCT/US2015/011756, 7 pages.

Office Action, dated Apr. 20, 2016, regarding U.S. Appl. No. 14/189,087, 31 pages.

Final Office Action, dated Jul. 6, 2016, regarding U.S. Appl. No. 14/189,087, 23 pages.

Office Action, dated Oct. 27, 2016, regarding U.S. Appl. No. 14/189,087, 23 pages.

Notice of Allowance, dated Mar. 1, 2017, regarding U.S. Appl. No. 14/189,087, 8 pages.

* cited by examiner

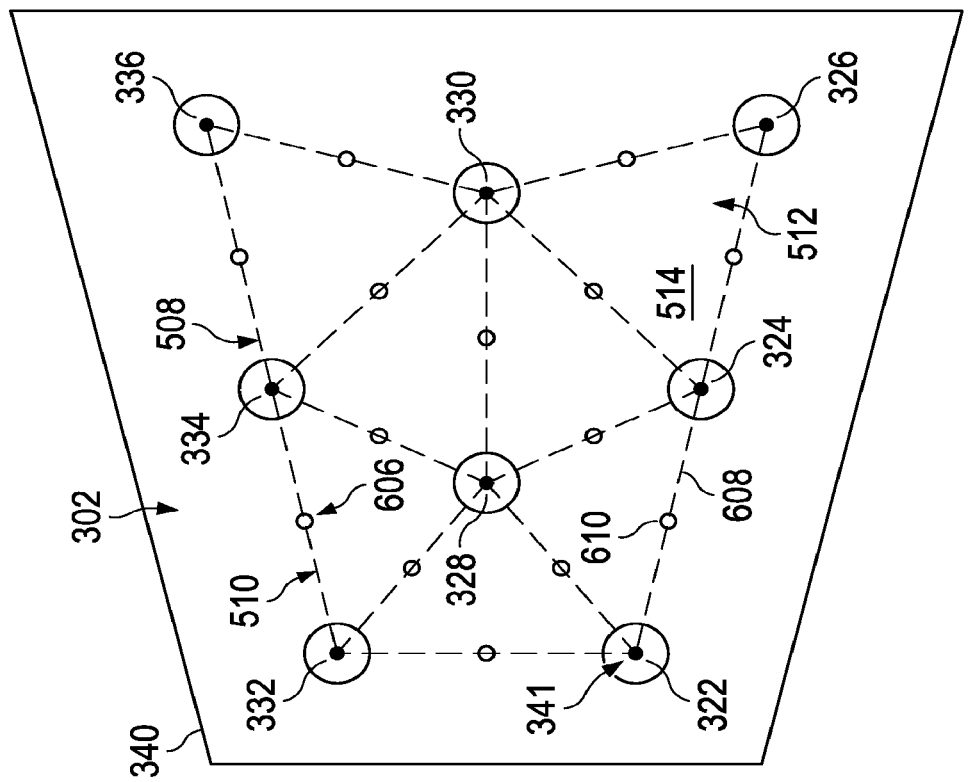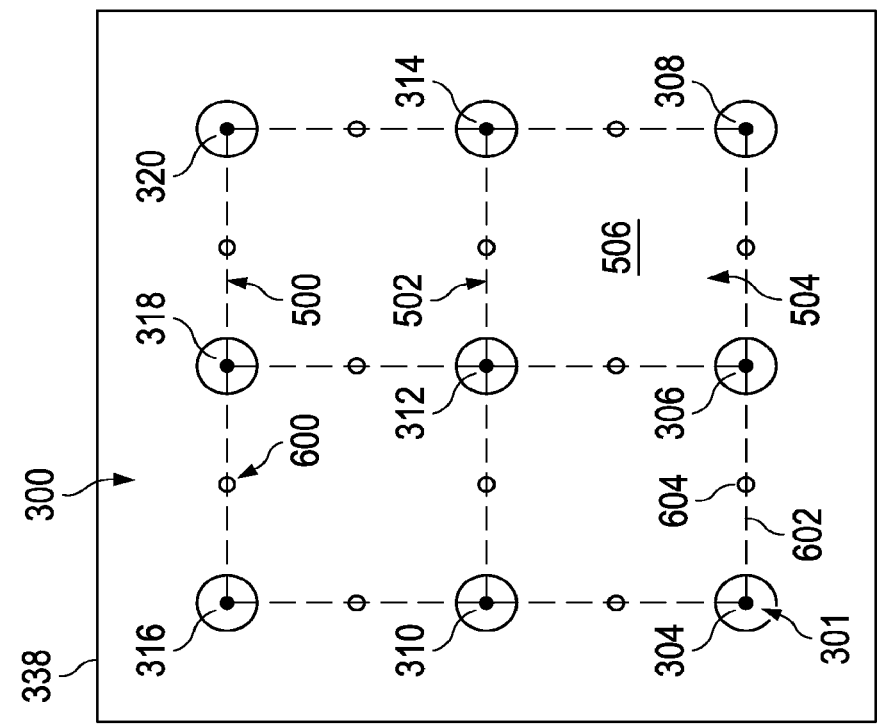
FIG. 6

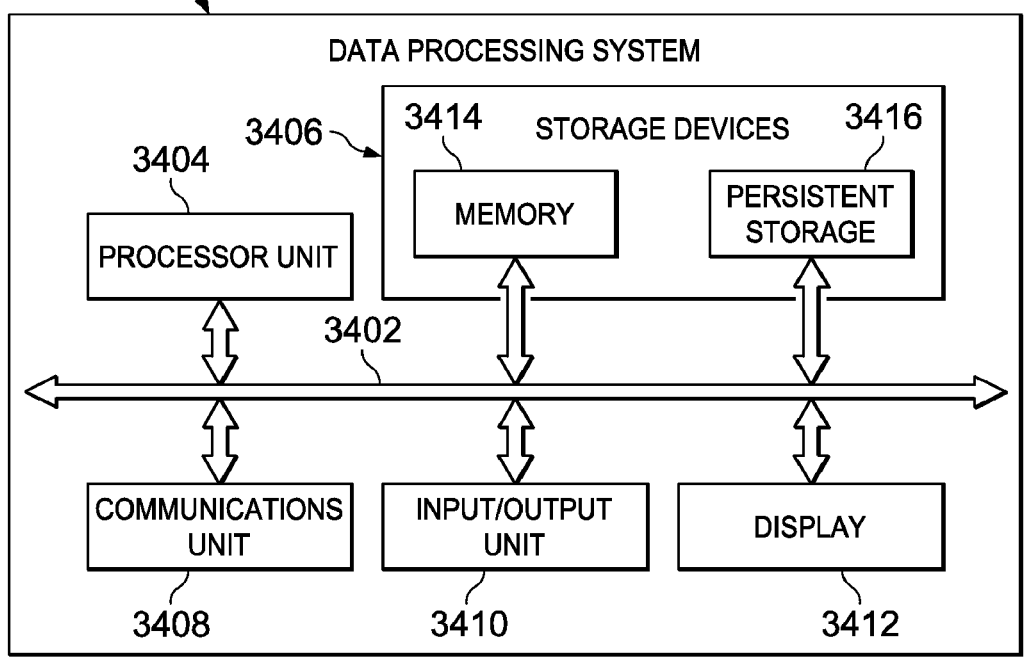
FIG. 34
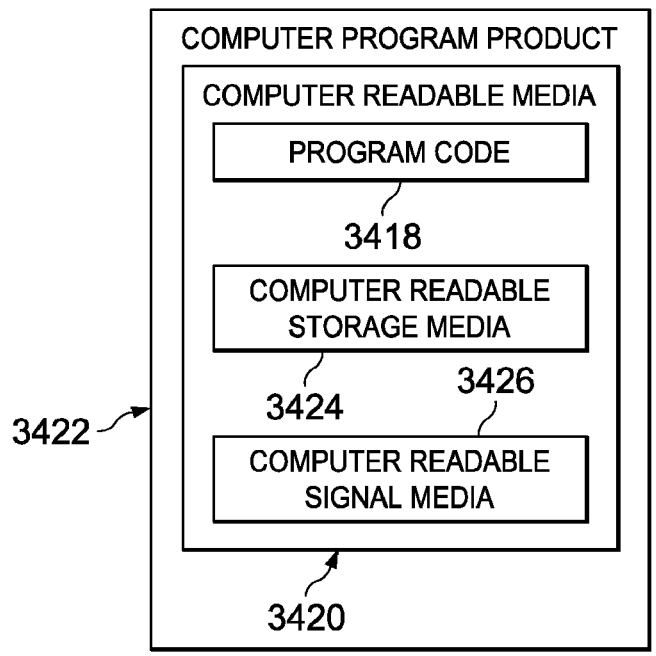

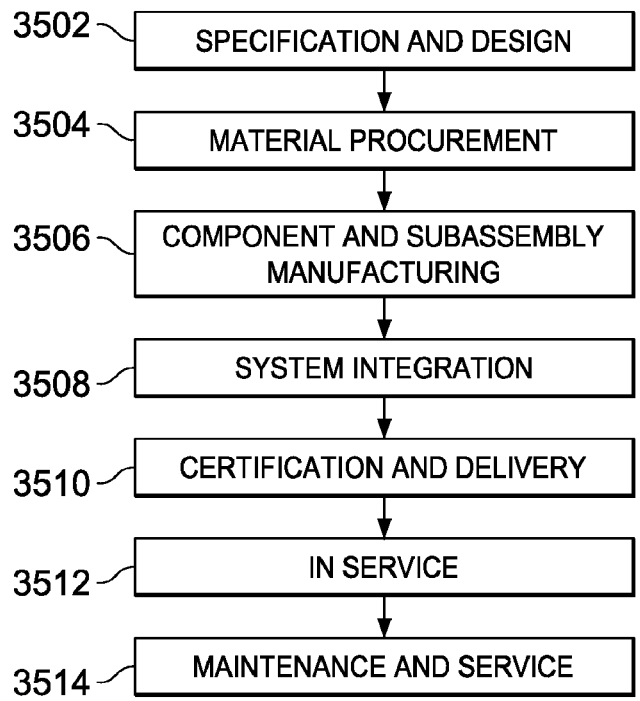
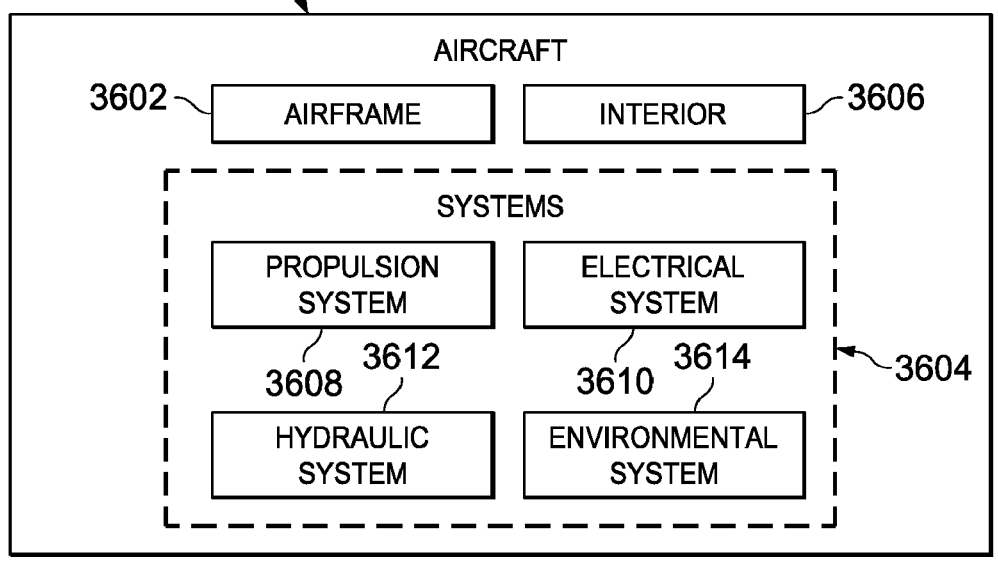

TWO-DIMENSIONAL MODEL OF TRIANGULAR SECTORS FOR USE IN GENERATING A MESH FOR FINITE ELEMENT ANALYSIS

This application is a continuation application of U.S. application Ser. No. 14/189,087, filed Feb. 25, 2014.

BACKGROUND INFORMATION

1. Field

The present disclosure relates generally to finite element analysis and, in particular, to generating a mesh for use in performing finite element analysis. Still more particularly, the present disclosure relates to a method and apparatus for generating a two-dimensional model comprised of triangular sectors for use in generating the mesh for the finite element analysis.

2. Background

Bolts are oftentimes used to secure various types of structures together. A bolted joint is formed when at least one bolt and nut are used to join at least two structures together. A bolted joint may include any number of structures that are joined together using any number of bolts. In some cases, it may be desirable to calculate the shear load carried by each bolt in the bolted joint. For example, the shear load carried by a particular bolt in a bolted joint may need to be calculated to determine whether the bolt will need to be replaced after some period of use. In another example, shear load calculations may need to be made to determine the type or size of bolts to be used in a bolted joint.

As the number of bolts that form the bolted joint increases, performing shear load calculations may become more and more difficult. Finite element analysis is oftentimes used to perform shear load calculations. Finite element analysis uses a mesh to represent the bolted joint. This mesh may be a two-dimensional or three-dimensional computer model comprised of finite elements. The finite elements may be surface elements for a two-dimensional mesh and solid elements for a three-dimensional mesh. In a two-dimensional mesh, each surface element has a polygonal shape. In a three-dimensional mesh, each solid element has a polyhedral shape. As the density of the mesh increases, the level of detail that may be analyzed using the mesh also increases.

Some currently available mesh generation techniques may generate a mesh for an object, such as a bolted joint, based on the geometry of the object. In some cases, these mesh generation techniques may be unable to generate a mesh for an object when the geometry of the object is too irregular or complex. When a mesh is generated, the mesh may itself be irregular. For example, the mesh may be comprised of different types of polyhedral shapes arranged in an irregular pattern. When a mesh is irregular, making modifications to the mesh may be more difficult than desired.

For example, during the manufacturing of an object, small changes may be made in the design of an object. These small design changes may result in corresponding changes in a portion of the geometry of the object. Depending on the level of irregularity of the geometry of the object, some currently available mesh generation techniques may be unable to modify the corresponding portion of the mesh based on the changes in the portion of the geometry of the object. Rather, a new mesh may need to be generated.

Generating a new mesh may require more time and processing resources than desired, which may lead to a reduced efficiency in the analysis of the object. This reduced efficiency may, in turn, lead to delays in the overall manufacturing of the object. Therefore, it would be desirable to have a method and apparatus that take into account at least some of the issues discussed above, as well as other possible issues.

SUMMARY

In one illustrative embodiment, an apparatus comprises a graph generator and a model generator. The graph generator forms a first graph based on a plurality of points within a region. The plurality of points represent a plurality of locations relative to a structure for a plurality of fastener devices configured to be installed in the structure to form a joint. The graph generator is configured to identify primary points and secondary points based on the first graph. The graph generator is further configured to form a second graph using the primary points, the secondary points, and the first graph. The model generator is configured to generate a two-dimensional model comprised of triangular sectors using vertices of the second graph. The two-dimensional model is configured for use in forming a mesh for use in performing finite element analysis for the joint.

In another illustrative embodiment, a finite element analysis system comprises a modeler, a mesh generator, and an analyzer. The modeler comprises a graph generator and a model generator. The graph generator forms a first graph based on a plurality of points within a region. The plurality of points represent a plurality of locations relative to a structure for a plurality of fastener devices configured to be installed in the structure to form a joint. The graph generator is configured to identify primary points and secondary points based on the first graph. The graph generator is further configured to form a second graph using the primary points, the secondary points, and the first graph. The model generator is configured to generate a two-dimensional model comprised of triangular sectors using vertices of the second graph. The mesh generator is configured to generate a mesh based on the two-dimensional model. The analyzer is configured to perform finite element analysis for the joint using the mesh. Results of the finite element analysis are used to control at least one of a design, manufacturing, or maintenance of the joint.

In yet another illustrative embodiment, a method for analyzing a joint is provided. A first graph is formed based on a plurality of points within a region. The plurality of points represent a plurality of fastener devices that comprise the joint. Primary points and secondary points are identified based on the first graph. A second graph is formed using the primary points, the secondary points, and the first graph. A two-dimensional model comprised of triangular sectors is generated using vertices of the second graph. The two-dimensional model is configured for use in forming a mesh for use in performing finite element analysis of the joint.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 6 is an illustration of the step of identifying edge midpoints in accordance with an illustrative embodiment;

FIG. 34 is an illustration of a data processing system in the form of a block diagram in accordance with an illustrative embodiment;

FIG. 35 is an illustration of an aircraft manufacturing and service method in the form of a block diagram in accordance with an illustrative embodiment;

FIG. 36 is an illustration of an aircraft in the form of a block diagram in which an illustrative embodiment may be implemented.

DETAILED DESCRIPTION

The illustrative embodiments recognize and take into account different considerations. For example, the illustrative embodiments recognize and take into account that it may be desirable to have a method for generating a mesh for an object in which the mesh is easily modifiable and easily repeatable. More particularly, the illustrative embodiments recognize and take into account that it may be desirable to have a method for generating a mesh for a bolted joint having irregular geometry with the same level of ease and accuracy as a bolted joint that has regular geometry.

Figure 1:
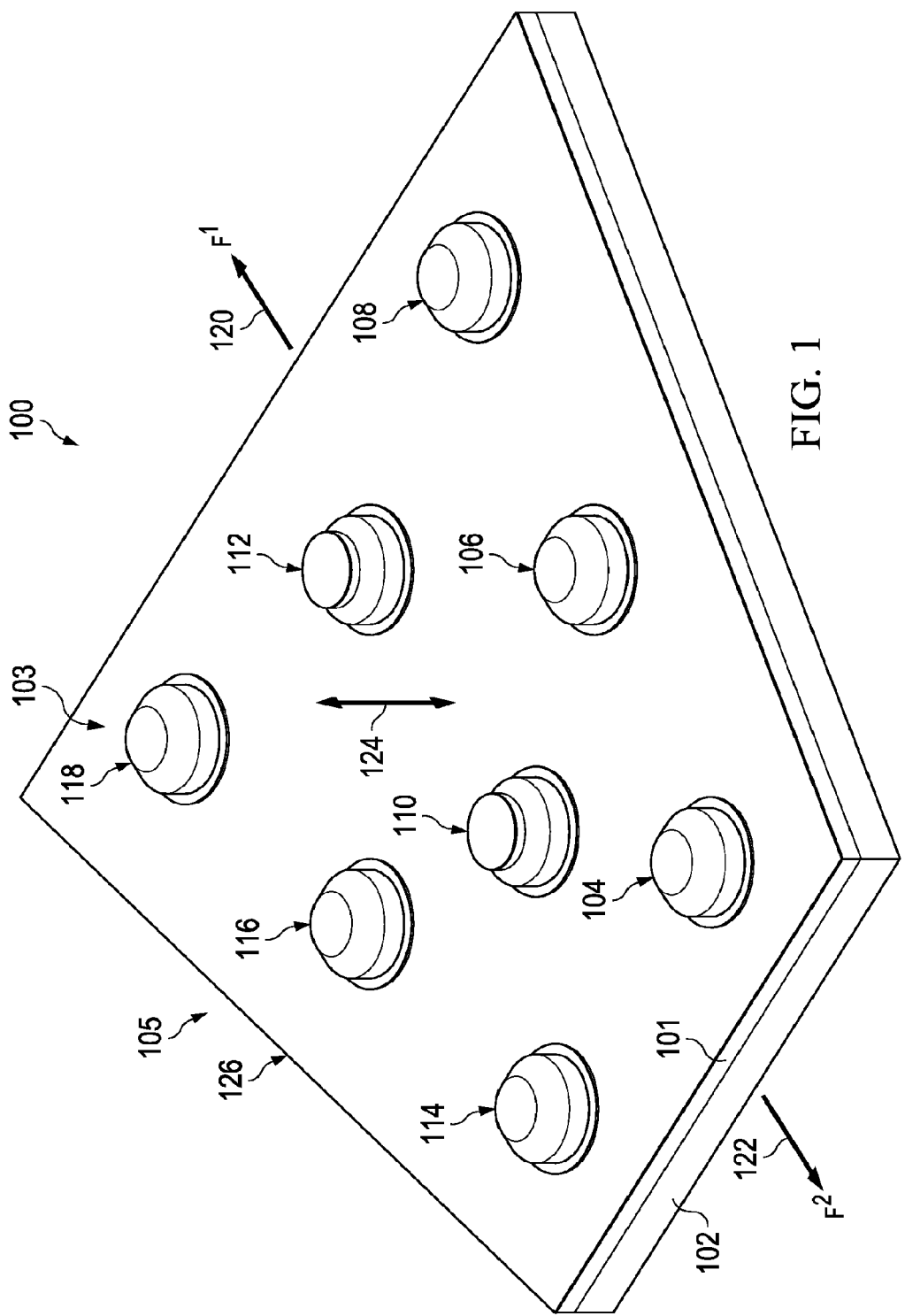
FIG. 1 is an illustration of a bolted joint having irregular geometry in accordance with an illustrative embodiment.

Referring now to the figures and, in particular, with reference to FIG. 1, an illustration of a bolted joint having irregular geometry is depicted in accordance with an illustrative embodiment. Bolted joint 100 is an example of a joint that may be manufactured based on the analysis provided by a finite element analysis system, such as finite element analysis system described below in FIG. 2.

In this illustrative example, bolted joint 100 is comprised of part 101, part 102, and plurality of fastener devices 103. Part 101 and part 102 may form structure 105.

As depicted, plurality of fastener devices 103 includes fastener devices 104, 106, 108, 110, 112, 114, 116, and 118. Each of plurality of fastener devices 103 is comprised of a bolt and a nut. Each of plurality of fastener devices 103 forms a bolted connection with part 101 and part 102 that joins part 101 to part 102.

The illustrative embodiments recognize and take into account that using finite element analysis to perform a structural analysis of bolted joint 100 may be desirable. In one illustrative example, the structural analysis of bolted joint 100 may include solving the load share problem of bolted joint 100. Solving the load share problem of bolted joint 100 may include, for example, determining the shear load that is carried by each of plurality of fastener devices 103 in bolted joint 100 when a tension load, compression load, shear load, moment, or some combination thereof is applied to bolted joint 100.

As one illustrative example, first force 120 applied to part 101 and second force 122 applied to part 102 may represent a tension load applied to bolted joint 100. It may be desirable to determine the shear load carried by each of plurality of fastener devices 103 in response to this tension load. The shear load carried by any one of plurality of fastener devices 103 may be in a direction substantially parallel to axis 124. In this illustrative example, axis 124 is substantially parallel to the center axis of each of plurality of fastener devices 103 in this illustrative example.

Bolted joint 100 has irregular geometry 126. As used herein, "irregular" means uneven, not straight, not uniform, not symmetrical, partially non-symmetrical, or some combination thereof. Partially non-symmetrical may mean not symmetrical about at least one axis.

In this illustrative example, the geometry of bolted joint 100 is irregular in that the pattern in which plurality of fastener devices 103 are located relative to part 101 and part 102 is partially non-symmetrical. In particular, the pattern in which plurality of fastener devices 103 are located relative to part 101 and part 102 is only symmetrical about axis 124 that passes through the centers of fastener device 110 and fastener device 112. Thus, this pattern is mostly non-symmetrical.

The illustrative embodiments recognize and take into account that generating a mesh for bolted joint 100 having irregular geometry 126 may be more difficult, time-consuming, or expensive than desired using some currently available mesh generation techniques. Thus, the illustrative embodiments provide a method, apparatus, and system for generating a mesh that may be simpler, less time-consuming, and less expensive than some currently available mesh generation techniques, while still allowing high-fidelity finite element analysis of objects having irregular geometry to be performed.

The illustrative embodiments recognize and take into account that having a method for easily, quickly, and accurately generating a mesh for an object having irregular geometry, such as bolted joint 100 having irregular geometry 126, may improve the efficiency of design operations, manufacturing operations, inspection and testing operations, maintenance operations, rework operations, repair operations, replacement operations, and other types of operations. For example, being able to more comprehensively evaluate a structural repair of bolted joint 100 that needs to be performed may enable the repair to be designed and performed in a shorter amount of time. Performing the repair in the shorter amount of time may, in turn, result in shorter down-time of the platform in which bolted joint 100 is used and thus, cost savings.

Further, the illustrative embodiments provide a method for generating a mesh for bolted joint 100 that allows one or more different portions of the mesh to be easily and quickly modified in response to small changes in the design or geometry of bolted joint 100. For example, the illustrative embodiments provide a method for generating the mesh that allows a selected portion of the mesh to be made denser as compared to the rest of the mesh in order to provide a finer level of detail that may allow a more comprehensive analysis of the corresponding portion of bolted joint 100 to be performed.

Based on this more comprehensive analysis of the corresponding portion of bolted joint 100, each of plurality of fastener devices 103 may be evaluated independently of the other fastener devices. This evaluation may be used to manufacture a new fastener device to replace the fastener devices or to manufacture an additional fastener device to be added to bolted joint 100 to strengthen bolted joint 100.

Being able to quickly and easily modify the mesh for bolted joint 100 may allow, for example, different design options to be quickly considered and evaluated without needing a new mesh for each different design option for bolted joint 100. Further, being able to quickly and easily modify the mesh for bolted joint 100 may allow decisions about the manufacturing of bolted joint 100 to be made without undesired delays. Thus bolted joint 100 may be designed and manufactured more quickly such that parts using bolted joint 100 may be assembled more quickly.

For example, bolted joint 100 may be one of a plurality of bolted joints used in the manufacturing of an aircraft. Being able to more quickly design and manufacture a single bolted joint 100 may result in desired time savings during the manufacturing of the aircraft.

Further, being able to quickly and easily modify the mesh for bolted joint 100 may allow the maintenance of the aircraft to be performed without undesired delays. For example, decisions about replacing one or more fastener devices with a different type of fastener device may be made more quickly by being able to quickly and easily modify a portion of a mesh rather than having to generate a new mesh each time a single change in plurality of fastener devices 103 is desired.

The illustrative embodiments provide a method for generating a mesh that may be used not only for bolted joint 100 but for objects having various types of irregular geometry. An example of a finite element analysis system that may be used to generate a mesh for an object, such as bolted joint 100, and to perform finite element analysis using this mesh is described in greater detail in FIG. 2 below.

Figure 2:
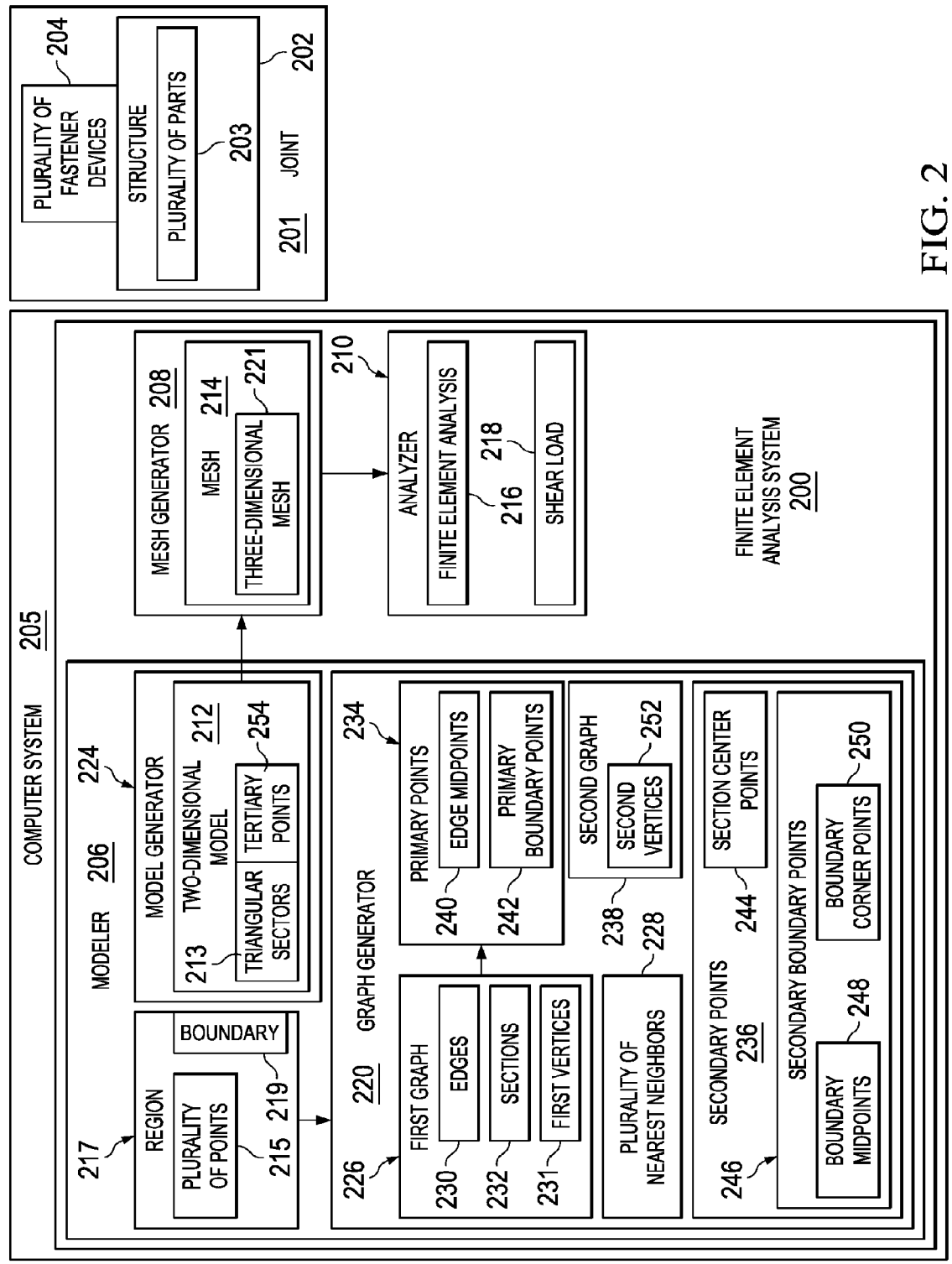
FIG. 2 is an illustration of a finite element analysis system in the form of a block diagram in accordance with an illustrative embodiment.

With reference now to FIG. 2, an illustration of a finite element analysis system is depicted in the form of a block diagram in accordance with an illustrative embodiment. Finite element analysis system 200 may be used to analyze an object, such as, for example, joint 201. Bolted joint 100 in FIG. 1 may be an example of one implementation for joint 201.

As depicted, joint 201 may be formed by structure 202 and plurality of fastener devices 204. As used herein, a "number of" items may include one or more items. In this manner, plurality of fastener devices 204 may include one or more fastener devices.

Structure 202 may be comprised of plurality of parts 203 in which at least two parts in plurality of parts 203 are positioned relative to each other such that the parts may be joined using plurality of fastener devices 204. Structure 105 in FIG. 1 may be an example of one implementation for structure 202. Further, part 101 and part 102 in FIG. 1 may be an example of one implementation for plurality of parts 203 that form structure 202. Fastener devices 104, 106, and 108 in FIG. 1 may be an example of one implementation for plurality of fastener devices 204.

In this illustrative example, finite element analysis system 200 is configured to generate mesh 214 of joint 201 and perform finite element analysis 216 for joint 201 using mesh 214. Finite element analysis system 200 may be implemented using hardware, software, or a combination of the two. When software is used, the operations performed by finite element analysis system 200 may be implemented using, for example, without limitation, program code configured to run on a processor unit. When firmware is used, the operations performed by finite element analysis system 200 may be implemented using, for example, without limitation, program code and data and stored in persistent memory to run on a processor unit.

When hardware is employed, the hardware may include one or more circuits that operate to perform the operations performed by finite element analysis system 200. Depending on the implementation, the hardware may take the form of a circuit system, an integrated circuit, an application specific integrated circuit (ASIC), a programmable logic device, or some other suitable type of hardware device configured to perform any number of operations.

A programmable logic device may be configured to perform certain operations. The device may be permanently configured to perform these operations or may be reconfigurable. A programmable logic device may take the form of, for example, without limitation, a programmable logic array, a programmable array logic, a field programmable logic array, a field programmable gate array, or some other type of programmable hardware device.

In some illustrative examples, the operations and processes performed by finite element analysis system 200 may be performed using organic components integrated with inorganic components. In some cases, the operations and processes may be performed by entirely organic components, excluding a human being. As one illustrative example, circuits in organic semiconductors may be used to perform these operations and processes.

In this illustrative example, finite element analysis system 200 may be implemented using computer system 205. Computer system 205 may include one or more computers depending on the implementation.

As depicted, finite element analysis system 200 includes modeler 206, mesh generator 208, and analyzer 210. Each of modeler 206, mesh generator 208, and analyzer 210 may be implemented using hardware, software, or a combination of the two. In one illustrative example, modeler 206, mesh generator 208, and analyzer 210 may each be implemented on a different computer in computer system 205. In another illustrative example, modeler 206, mesh generator 208, and analyzer 210 may be implemented on the same computer in computer system 205.

Modeler 206 is configured to generate two-dimensional model 212 for use by mesh generator 208. Two-dimensional model 212 generated by modeler 206 may be a two-dimensional grid comprised of triangular sectors 213. When triangular sectors 213 are arranged such that no gaps or overlaps are present among triangular sectors 213, two-dimensional model 212 may be referred to as a tessellation. In one illustrative example, two-dimensional model 212 may be referred to as a triangular tessellation.

Mesh generator 208 may use two-dimensional model 212 to generate mesh 214 representing joint 201. As used herein, a mesh, such as mesh 214, may be a two-dimensional model comprised of polygonal shapes or a three-dimensional model comprised of polyhedral shapes. These polygonal shapes may be referred to as surface elements. The polyhedral shapes may be referred to as solid elements. In one illustrative example, mesh 214 takes the form of three-dimensional mesh 221.

Analyzer 210 may use mesh 214 to analyze joint 201. In particular, analyzer 210 may perform finite element analysis 216 using mesh 214. In this illustrative example, finite element analysis 216 may be performed to determine shear load 218 carried by each of plurality of fastener devices 204 in joint 201.

As depicted, modeler 206 may include graph generator 220 and model generator 224. Each of graph generator 220 and model generator 224 may be implemented using hardware, software, or a combination of the two.

Graph generator 220 uses region 217 to represent a portion of interest of joint 201. Region 217 may be a two-dimensional area having boundary 219 that defines region 217. Region 217 may be used to represent a plan view of at least a portion of joint 201. As used herein, a plan view is an orthographic projection of a three-dimensional object from the position of a horizontal plane through the object. Further, as used herein, a portion of an item may be some of the item or the entire item. Boundary 219 may define the portion of structure 202 included in the portion of joint 201 that is of interest.

Plurality of points 215 may be present in region 217. Plurality of points 215 may represent plurality of fastener devices 204. Plurality of points 215 represent a plurality of locations relative to structure 202 for plurality of fastener devices 204 configured to be installed in structure 202 to form joint 201. In particular, the location of a point in plurality of points 215 within region 217 may represent the location of a corresponding fastener device in plurality of fastener devices 204 with respect to structure 202.

Graph generator 220 uses plurality of points 215 to form first graph 226. As used herein, a "graph" may be a collection of points interconnected by links. The points may be referred to as "vertices" and the links may be referred to as "edges."

To form first graph 226, graph generator 220 identifies plurality of nearest neighbors 228 for each of plurality of points 215. Graph generator 220 then connects each point in plurality of points 215 to each of plurality of nearest neighbors 228 identified for that point to form edges 230 of first graph 226. Plurality of points 215 may form first vertices 231 of first graph 226. Each of edges 230 is a link or connection between two of plurality of points 215. Edges 230 form sections 232. Each of sections 232 is a closed polygonal shape, the sides of which are formed by a portion of edges 230. When no spaces or gaps are present between sections 232, first graph 226 may be referred to as a first tessellation.

Graph generator 220 then identifies primary points 234 and secondary points 236 using first graph 226. As depicted, primary points 234 may include edge midpoints 240 and primary boundary points 242. As used herein, an "edge midpoint," such as one of edge midpoints 240, is a point located along a corresponding one of edges 230. In this illustrative example, an edge midpoint is the point along an edge exactly halfway between the two points connected by the edge. However, in other illustrative examples, an edge midpoint may be a point located at some other location between the two points connected by the edge.

As used herein, a "primary boundary point," such as one of primary boundary points 242, is the point at the intersection of boundary 219 of region 217 and a line substantially perpendicular to boundary 219 that also passes through a vertex in first vertices 231 of first graph 226. Depending on the implementation and the manner in which plurality of points 215 are arranged within region 217, primary boundary points 242 may include fewer points than, as many points as, or more points than plurality of points 215.

Secondary points 236 include section center points 244 and secondary boundary points 246. As used herein, a "section center point," such as one of section center points 244, is a point within a corresponding one of sections 232. This point may be located at the geometric center of or may be offset from the geometric center of the corresponding section, depending on the implementation.

Secondary boundary points 246 may include boundary midpoints 248. Boundary midpoints 248 may be located along boundary 219. As used herein, a "boundary midpoint," such as one of boundary midpoints 248, may be located between an adjacent pair of primary boundary points 242. In this illustrative example, a boundary midpoint is located halfway between a corresponding adjacent pair of primary boundary points 242.

Secondary boundary points 246 may also include boundary corner points 250 depending on the shape of boundary 219. As used herein, a "boundary corner point," such as one of boundary corner points 250, is a point at a corner formed by boundary 219. When boundary 219 has a circular shape, an elliptical shape or some other type of curved shape, secondary boundary points 246 may not include boundary corner points 250.

Graph generator 220 connects each of secondary points 236 to a corresponding portion of primary points 234 to form second graph 238. When no spaces or gaps are present between the sections formed in second graph 238, second graph 238 may be referred to as a second tessellation. The corresponding portion of primary points 234 for a particular secondary point may be the portion of primary points 234 located around that secondary point. Second vertices 252 of second graph 238 include all of the vertices of first graph 226 as well as primary points 234 and secondary points 236. Thus, first graph 226 may be considered "embedded within" second graph 238.

Model generator 224 uses second graph 238 to form two-dimensional model 212 comprised of triangular sectors 213. In particular, model generator 224 connects each of secondary points 236 in second graph 238 to neighboring vertices of first graph 226 to form triangular sectors 213. In other words, model generator 224 connects each of secondary points 236 to the points in plurality of points 215 located around that secondary point to form triangular sectors 213 that collectively form two-dimensional model 212.

Each of triangular sectors 213 may have a first vertex that coincides with one of plurality of points 215, a second vertex that coincides with one of primary points 234, and a third vertex that coincides with one of secondary points 236. The different vertices of triangular sectors 213 may form tertiary points 254. At least a portion of each of triangular sectors 213 may be used to define one or more solids of revolution. Mesh generator 208 may be configured to mesh these one or more solids of revolution with, for example, without limitation, hexahedral finite elements to form mesh 214.

The method for forming two-dimensional model 212 described above may be used to quickly and accurately generate mesh 214 representing joint 201 regardless of whether the pattern in which plurality of fastener devices 204 is arranged is regular or irregular. Prior to performing finite element analysis 216, a level of detail of a selected portion of mesh 214 may be increased to a next level of detail by applying a selected pattern to each of a number of elements in the selected portion of mesh 214. In some cases, the same selected pattern may be applied to each of the number of elements. Applying a pattern to an element, as used herein, may mean dividing the element into smaller elements according to the pattern or some algorithm based on the pattern.

Further, this next level of detail of the selected portion of mesh 214 may be increased to another next level of detail by applying the same selected pattern or a different selected pattern to each of a number of elements in the selected portion of mesh 214. In some cases, the next level of detail of a new selected portion of mesh 214 may be increased to another next level of detail by applying the same or a different selected pattern to the each of the number of elements in the new selected portion of mesh 214. This process may be repeated any number of times in order to achieve a desired level of detail within the selected portion of mesh 214. Being able to quickly and easily increase the level of detail within a portion of mesh 214 may allow the selected portion of mesh 214 to be analyzed independently of the other portions of mesh 214 without having to create an entirely new mesh.

In one illustrative example, the portion of mesh 214 for which the level of detail may be increased may be the portion corresponding to the location of a fastener device in plurality of fastener devices 204 or some area around the fastener device. Increasing the level of detail of just this portion of mesh 214 allows stress concentrations within this portion to be modeled with a desired level of fidelity without requiring the level of detail to be increased for the entire mesh 214.

The illustration of finite element analysis system 200 in FIG. 2 is not meant to imply physical or architectural limitations to the manner in which an illustrative embodiment may be implemented. Other components in addition to or in place of the ones illustrated may be used. Some components may be optional. Also, the blocks are presented to illustrate some functional components. One or more of these blocks may be combined, divided, or combined and divided into different blocks when implemented in an illustrative embodiment.

For example, in other illustrative examples, modeler 206 may be considered separate from finite element analysis system 200. In some illustrative examples, modeler 206 and mesh generator 208 may be implemented on the same computer in computer system 205. In other illustrative examples, modeler 206 may be implemented as part of mesh generator 208.

With reference now to FIGS. 3-11, illustrations of a process for generating a two-dimensional model for a joint having a plurality of fastener devices arranged in a regular pattern and for a joint having a plurality of fastener devices arranged in an irregular pattern are depicted in accordance with an illustrative embodiment. The steps performed to generate the two-dimensional model for these two types of joints are the same.

Figure 3:
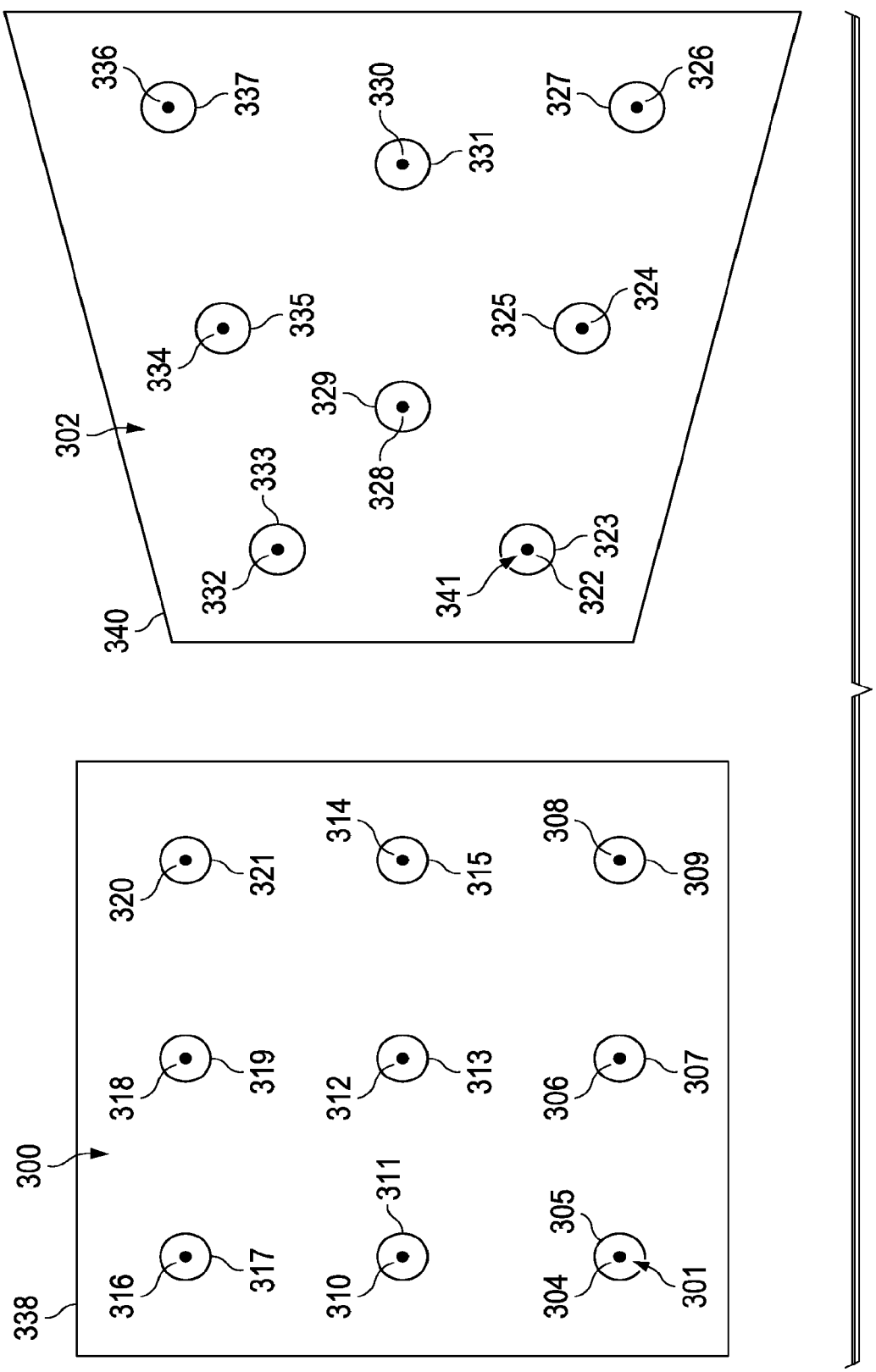
FIG. 3 is an illustration of the step of identifying a plurality of points within a region that represent a plurality of fastener devices in a joint in accordance with an illustrative embodiment.

Turning now to FIG. 3, an illustration of the step of identifying a plurality of points within a region that represent a plurality of fastener devices in a joint is depicted in accordance with an illustrative embodiment. In this illustrative example, first region 300 and second region 302 may be examples of implementations for region 217 in FIG. 2.

First region 300 may be used to represent a plan view of a first joint of interest having a substantially regular geometry. Second region 302 may be used to represent a plan view of a second joint of interest having an irregular geometry. In particular, in this illustrative example, second region 302 may represent a plan view of bolted joint 100 from FIG. 1.

As depicted, plurality of points 301 are present within first region 300. Plurality of points 301 may be an example of one implementation for plurality of points 215 in FIG. 2. Plurality of points 301 include points 304, 306, 308, 310, 312, 314, 316, 318, and 320. Plurality of points 341 are present within second region 302. Plurality of points 341 include points 322, 324, 326, 328, 330, 332, 334, and 336. Plurality of points 341 are another example of one implementation for plurality of points 215 in FIG. 2.

Further, as depicted, first region 300 may have first boundary 338. First boundary 338 may define a portion of a first structure on which fastener devices may be installed to form the first joint of interest. Second region 302 may have second boundary 340. Second boundary 340 may define a portion of a second structure on which fastener devices may be installed to form the second joint of interest. In particular, in this illustrative example, second boundary 340 may define the portion of structure 105 in FIG. 1 on which plurality of fastener devices 103 are installed to form bolted joint 100.

Each of plurality of points 301 within first region 300 represents the center of a hole in the first structure configured to receive a fastener device. The center of the hole may be used as a location of the hole, as well as the location of the corresponding fastener device to be installed in the hole. In this illustrative example, points 304, 306, 308, 310, 312, 314, 316, 318, and 320 represent the centers of holes 305, 307, 309, 311, 313, 315, 317, 319, and 321, respectively. Holes 305, 307, 309, 311, 313, 315, 317, 319, and 321 in first region 300 may be representations of actual holes that would be formed in the first structure.

Each of plurality of points 341 within second region 302 represents the center of a hole in the second structure configured to receive one of plurality of fastener devices 103. The center of the hole may be used as the location of the hole, as well as the location of the corresponding fastener device to be installed in the hole. In this illustrative example, points 322, 324, 326, 328, 330, 332, 334, and 336 represent the centers of holes 323, 325, 327, 329, 331, 333, 335, and 337 respectively. Holes 323, 325, 327, 329, 331, 333, 335, and 337 may represent the holes in structure 105 in FIG. 1 configured to receive fastener devices 104, 106, 108, 110, 112, 114, 116, and 118, respectively, in FIG. 1.

In this illustrative example, plurality of points 301 within first region 300 may be arranged in a regular pattern. The pattern may be "regular" in that the points are substantially evenly spaced apart according to an easily discernible pattern. However, plurality of points 341 within second region 302 may be arranged in an irregular pattern. The pattern may be irregular in that the points are not substantially evenly spaced apart and that the pattern is not easily discernible.

Figure 4:
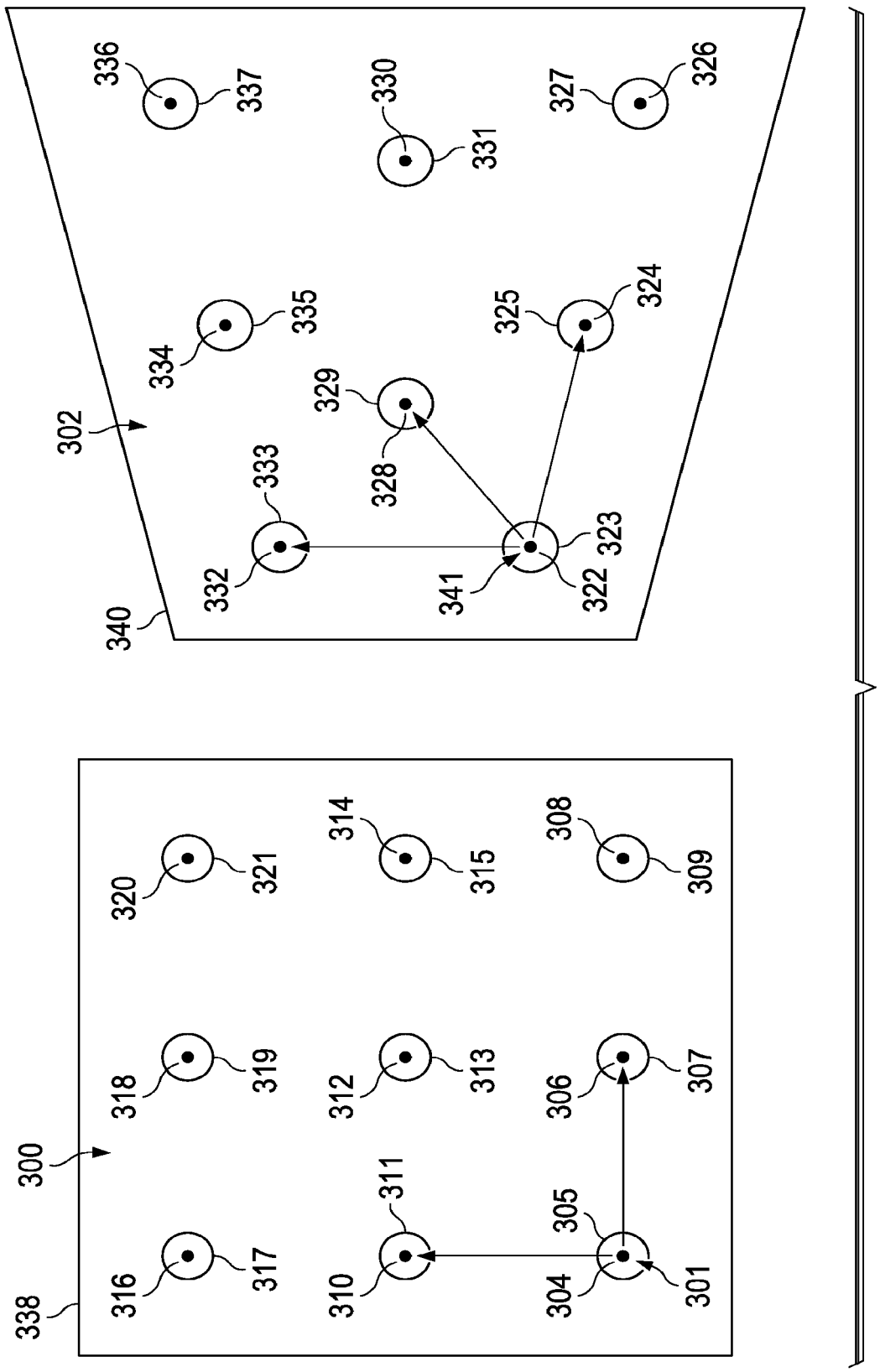
FIG. 4 is an illustration of the step of identifying the plurality of nearest neighbors for a point in accordance with an illustrative embodiment.

With reference now to FIG. 4, an illustration of the step of identifying the plurality of nearest neighbors for a point is depicted in accordance with an illustrative embodiment. As depicted, point 310 and point 306 are identified as being the nearest neighbors of point 304 within first region 300. Points 324, 328, and 332 are identified as being the nearest neighbors of point 322 within second region 302.

The step of identifying the nearest neighbors for a point is repeated for each of plurality of points 301 and for each of plurality of points 341. An example of one implementation for a process that may be used to identify the nearest neighbors of a point is described further below in FIGS. 20-26 below.

Figure 5:
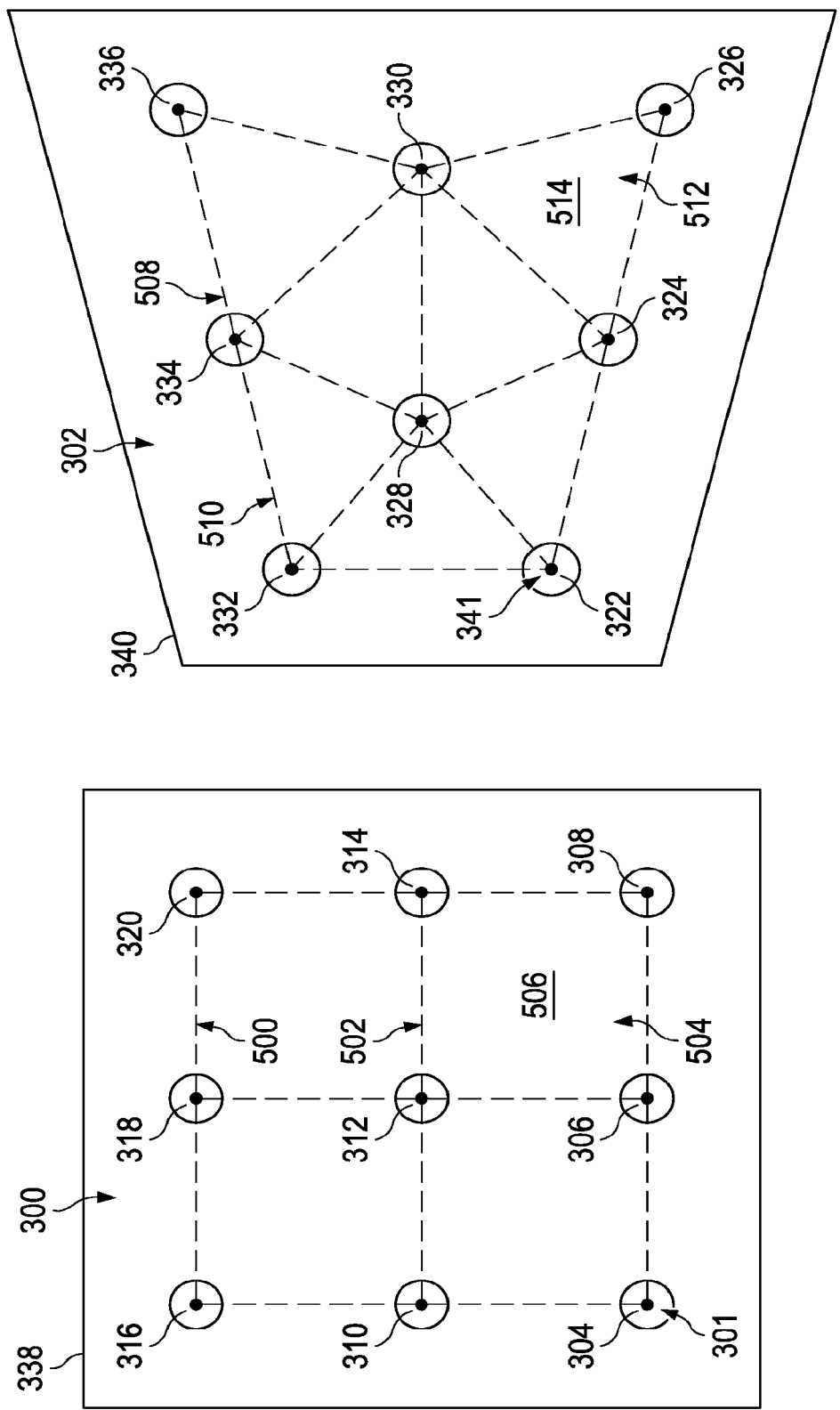
FIG. 5 is an illustration of the step of forming a first graph in accordance with an illustrative embodiment.

Turning now to FIG. 5, an illustration of the step of forming a first graph is depicted in accordance with an illustrative embodiment. In this illustrative example, first graph 500 has been formed using plurality of points 301. First graph 508 has been formed using plurality of points 341. First graph 500 may be an example of one implementation for first graph 226 in FIG. 2.

As depicted, first graph 500 is formed by edges 502. Edges 502 are formed by connecting each point in plurality of points 301 to each of that point's nearest neighbors. In response to edges 502 being formed, sections 504 are formed. Section 506 is an example of one of sections 504. Edges 502 and sections 504 are examples of implementations for edges 230 and sections 232, respectively, in FIG. 2.

Similarly, first graph 508 has been formed using plurality of points 341. First graph 508 has been formed using plurality of points 341. First graph 508 may be another example of one implementation for first graph 226 in FIG. 2.

As depicted, first graph 508 is formed by edges 510. Edges 510 are formed by connecting each point in plurality of points 341 to each of that point's nearest neighbors. In response to edges 510 being formed, sections 512 are formed. Section 514 is an example of one of sections 512. Edges 510 and sections 512 are examples of implementations for edges 230 and sections 232, respectively, in FIG. 2.

With reference now to FIG. 6, an illustration of the step of identifying edge midpoints is depicted in accordance with an illustrative embodiment. In this illustrative example, edge midpoints 600 are identified for edges 502 of first graph 500. Edge 602 may be an example of one of edges 502. As depicted, edge 602 connects point 304 to point 306. Edge midpoint 604, an example of one of edge midpoints 600, is the halfway point between point 304 and point 306 in this example.

Edge midpoints 606 are identified for edges 510 of first graph 508. Edge 608 may be an example of one of edges 510. As depicted, edge 608 connects point 322 to point 324. Edge midpoint 610, an example of one of edge midpoints 606, is the halfway point between point 304 and point 306 in this example.

Edge midpoints 600 and edge midpoints 606 may be examples of implementations for edge midpoints 240 in FIG. 2. As described above, each of edge midpoints 600 and edge midpoints 606 may be the halfway point between the pair of points connected by the corresponding edge. However, in other illustrative examples, each of edge midpoints 600 and edge midpoints 606 may be offset by some selected distance from the halfway point between the pair of points connected by the corresponding edge.

Figure 7:
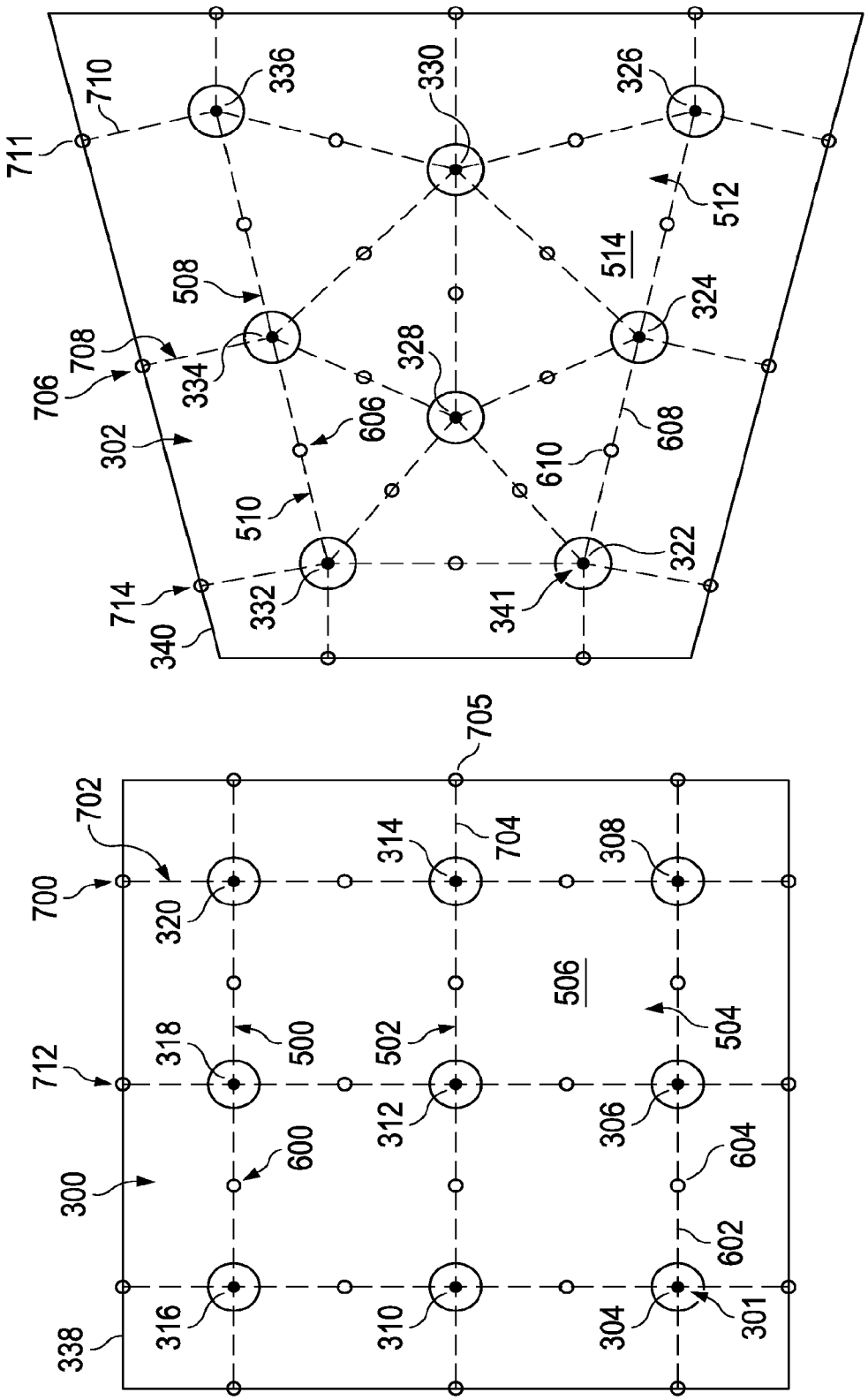
FIG. 7 is an illustration of the step of identifying primary boundary points in accordance with an illustrative embodiment.

With reference now to FIG. 7, an illustration of the step of identifying primary boundary points is depicted in accordance with an illustrative embodiment. In this illustrative example, primary boundary points 700 are identified along first boundary 338 of first region 300. Primary boundary points 700 may be identified as the intersections of first boundary 338 with lines 702 that pass through plurality of points 301 and are substantially perpendicular to first boundary 338.

Line 704 may be an example of one of lines 702. Line 704 passes through point 314 and is substantially perpendicular to first boundary 338. Primary boundary point 705, an example of one of primary boundary points 700, is identified at the intersection of line 704 and first boundary 338.

Similarly, primary boundary points 706 are identified along second boundary 340 of second region 302. Primary boundary points 706 are identified as the intersections of second boundary 340 with lines 708 that pass through plurality of points 341 and are substantially perpendicular to second boundary 340.

Line 710 may be an example of one of lines 708. Line 710 passes through point 336 and is substantially perpendicular to second boundary 340. Primary boundary point 711, an example of one of primary boundary points 706, is identified at the intersection of line 710 and second boundary 340.

Primary boundary points 700 and primary boundary points 706 are examples of implementations for primary boundary points 242 in FIG. 2. Edge midpoints 600 and primary boundary points 700 form primary points 712, which may be one example of one implementation for primary points 234 in FIG. 2. Edge midpoints 606 and primary boundary points 706 form primary points 714, which may be another example of one implementation for primary points 234 in FIG. 2.

Figure 8:
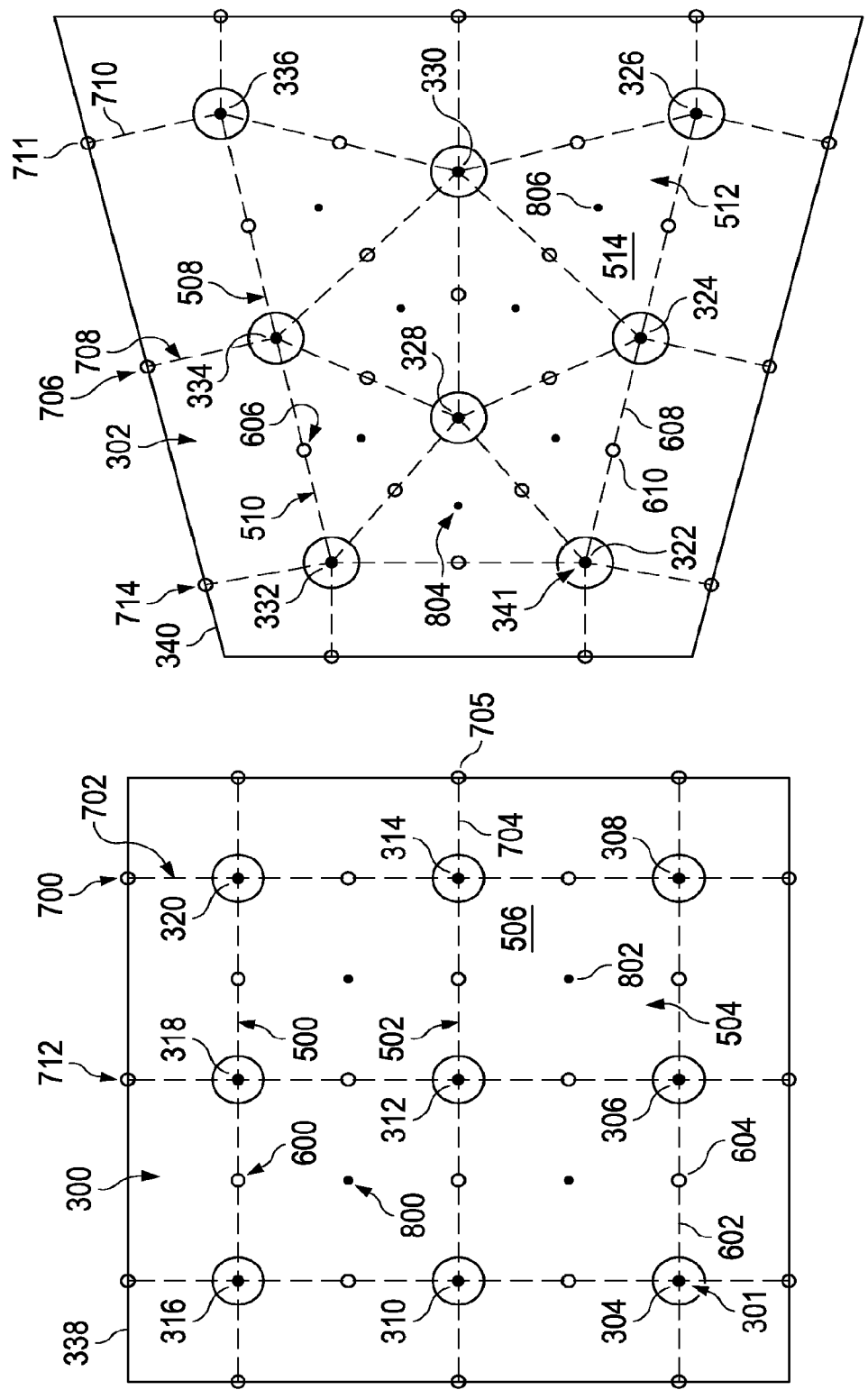
FIG. 8 is an illustration of the step for identifying section center points in accordance with an illustrative embodiment.

With reference now to FIG. 8, an illustration of the step for identifying section center points is depicted in accordance with an illustrative embodiment. In this illustrative example, section center points 800 are identified for sections 504 formed by first graph 500. Section center point 802 may be an example of one of section center points 800. As depicted, section center point 802 is located at the geometric center of the corresponding section 506.

Similarly, section center points 804 are identified for sections 512 formed by first graph 508. Section center point 806 may be an example of one of section center points 804. As depicted, section center point 806 is located at the geometric center of section 514.

In other illustrative examples, section center point 802 may be located offset from the geometric center of the corresponding section 506. Further, in these other illustrative examples, section center point 806 may be located offset from the geometric center of section 514.

Section center points 800 and section center points 804 are examples of implementations for section center points 244 in FIG. 2. As described above, each of section center points 800 and section center points 804 may be the geometric center of a corresponding section. However, in other illustrative examples, each of section center points 800 and section center points 804 may be offset from the geometric center of a corresponding section.

Figure 9:
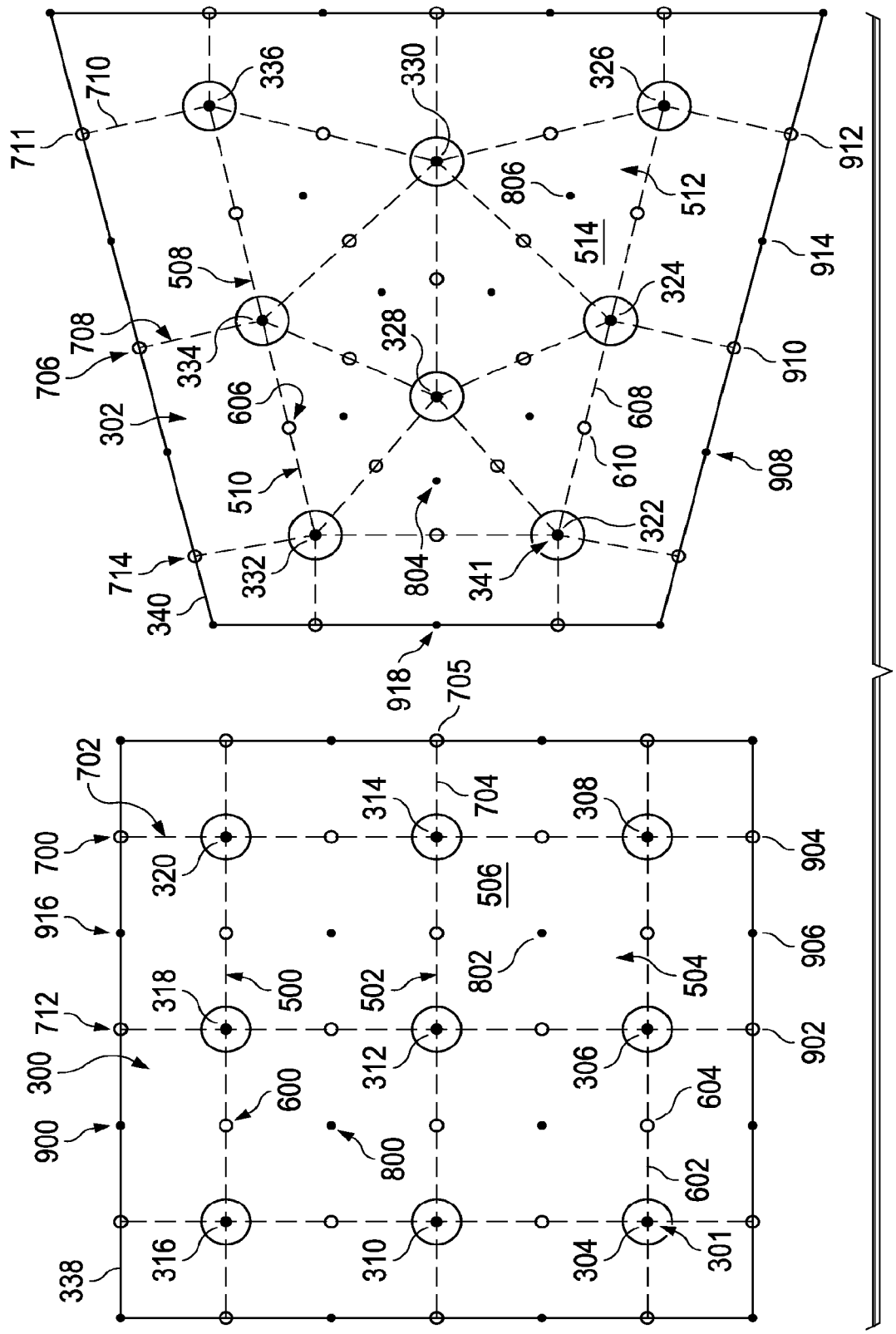
FIG. 9 is an illustration of the step for identifying secondary boundary points in accordance with an illustrative embodiment.

With reference now to FIG. 9, an illustration of the step for identifying secondary boundary points is depicted in accordance with an illustrative embodiment. In this illustrative example, secondary boundary points 900 are identified along first boundary 338 of first region 300. Primary boundary point 902 and primary boundary point 904 may be examples of primary boundary points 700. Secondary boundary point 906, an example of one of secondary boundary points 900, is the halfway point between primary boundary point 902 and primary boundary point 904.

Secondary boundary points 908 are identified along second boundary 340 of second region 302. Primary boundary point 910 and primary boundary point 912 may be examples of primary boundary points 706. Secondary boundary point 914, an example of one of secondary boundary points 908, is the halfway point between primary boundary point 910 and primary boundary point 912.

Secondary boundary points 900 and secondary boundary points 908 are examples of implementations for secondary boundary points 246 in FIG. 2. As described above, each of secondary boundary points 900 and secondary boundary points 908 may be the halfway point between the corresponding pair of primary boundary points. However, in other illustrative examples, each of secondary boundary points 900 and secondary boundary points 908 may be offset by some selected distance from the halfway point between the corresponding pair of primary boundary points.

Section center points 800 and secondary boundary points 900 form secondary points 916, which may be an example of one implementation for secondary points 236 in FIG. 2. Section center points 804 and secondary boundary points 908 form secondary points 918, which may be another example of one implementation for secondary points 236 in FIG. 2.

Figure 10:
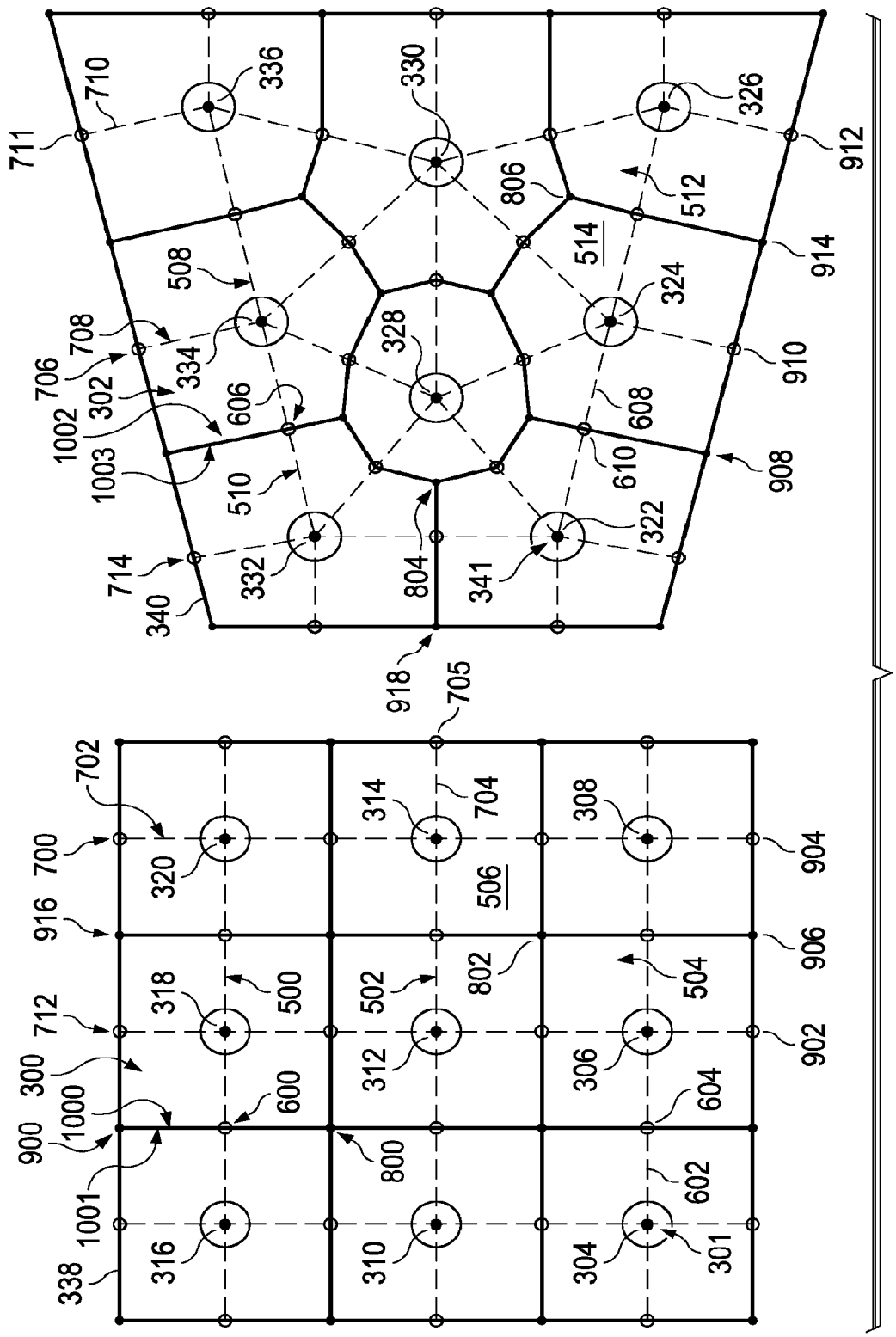
FIG. 10 is an illustration of the step of forming a second graph in accordance with an illustrative embodiment.

With reference now to FIG. 10, an illustration of the step of forming a second graph is depicted in accordance with an illustrative embodiment. In this illustrative example, second graph 1000 is formed by connecting each of secondary points 916 to a corresponding portion of primary points 712. The corresponding portion of primary points 712 may be the portion located around the secondary point. The connections formed may form edges 1001 of second graph 1000.

Second graph 1002 is formed by connecting each of secondary points 918 to a corresponding portion of primary points 714. The corresponding portion of primary points 714 may be the portion located around the secondary point. The connections formed may be edges 1003 of second graph 1002.

Second graph 1000 and second graph 1002 may be examples of implementations for second graph 238 in FIG. 2. As depicted, first graph 500 may be included within, or embedded within, second graph 1000. Further, first graph 508 may be included within, or embedded within, second graph 1002.

Figure 11:
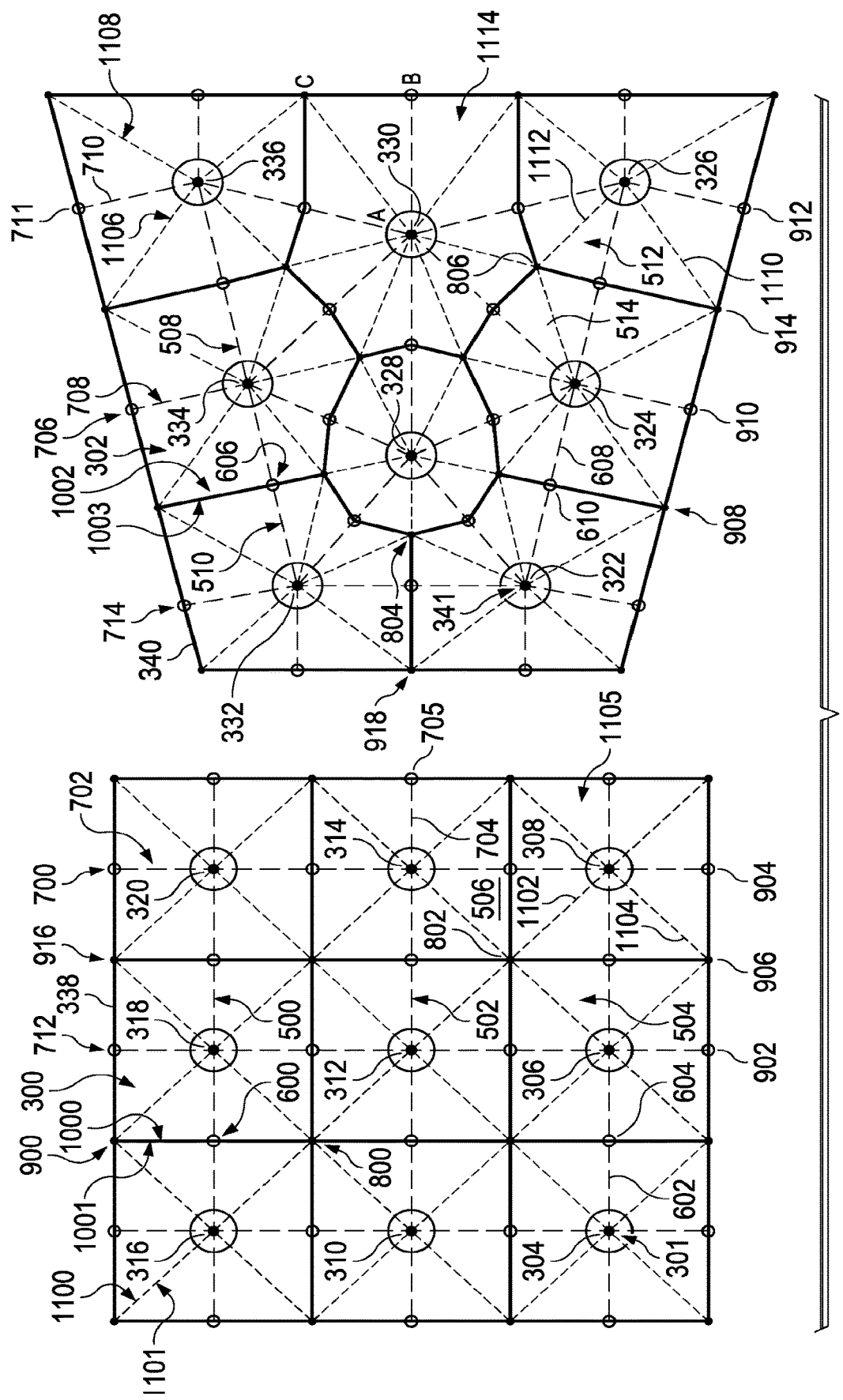
FIG. 11 is an illustration of the step of forming a two-dimensional model in accordance with an illustrative embodiment.

With reference now to FIG. 11, an illustration of the step of forming a two-dimensional model is depicted in accordance with an illustrative embodiment. In this illustrative example, two-dimensional model 1100 is formed using secondary points 916 and the vertices of first graph 500. The vertices of first graph 500 are plurality of points 301.

Each of secondary points 916 may be connected to the neighboring vertices of first graph 500 by edges 1101. For example, section center point 802 may be connected to point 308 to form edge 1102 and secondary boundary point 906 may be connected to point 308 to form edge 1104. In response to edges 1101 being formed, triangular sectors 1105 may be formed. Thus, two-dimensional model 1100 may be comprised of triangular sectors 1105.

In this illustrative example, two-dimensional model 1106 is formed using secondary points 918 and the vertices of first graph 508. The vertices of first graph 508 are plurality of points 341.

Each of secondary points 918 may be connected to the neighboring vertices of first graph 508 to form edges 1108. For example, section center point 806 may be connected to point 326 to form edge 1112 and secondary boundary point 914 may be connected to point 326 to form edge 1110. In response to edges 1108 being formed, triangular sectors 1114 may be formed. Thus, two-dimensional model 1106 may be comprised of triangular sectors 1114.

Two-dimensional model 1100 and two-dimensional model 1106 are examples of implementations for two-dimensional model 212 in FIG. 2. Two-dimensional model 1100 and two-dimensional model 1106 may each be used by a mesh generator, such as mesh generator 208 in FIG. 2, to form a mesh, such as mesh 214 in FIG. 2. In particular, the mesh generator may use two-dimensional model 1100 to form a three-dimensional mesh representing the joint represented by first region 300. Similarly, the mesh generator may use two-dimensional model 1106 to form a three-dimensional mesh representing the joint represented by second region 302.

By being comprised entirely of triangular sectors having similar shapes but different sizes, the mesh pattern used to generate meshes for two-dimensional model 1100 and two-dimensional model 1106 may be repeatable for each of the triangular sectors. This repeatability may reduce the overall time, processing resources, and computer software programming complexity needed to generate the meshes.

Figure 12:
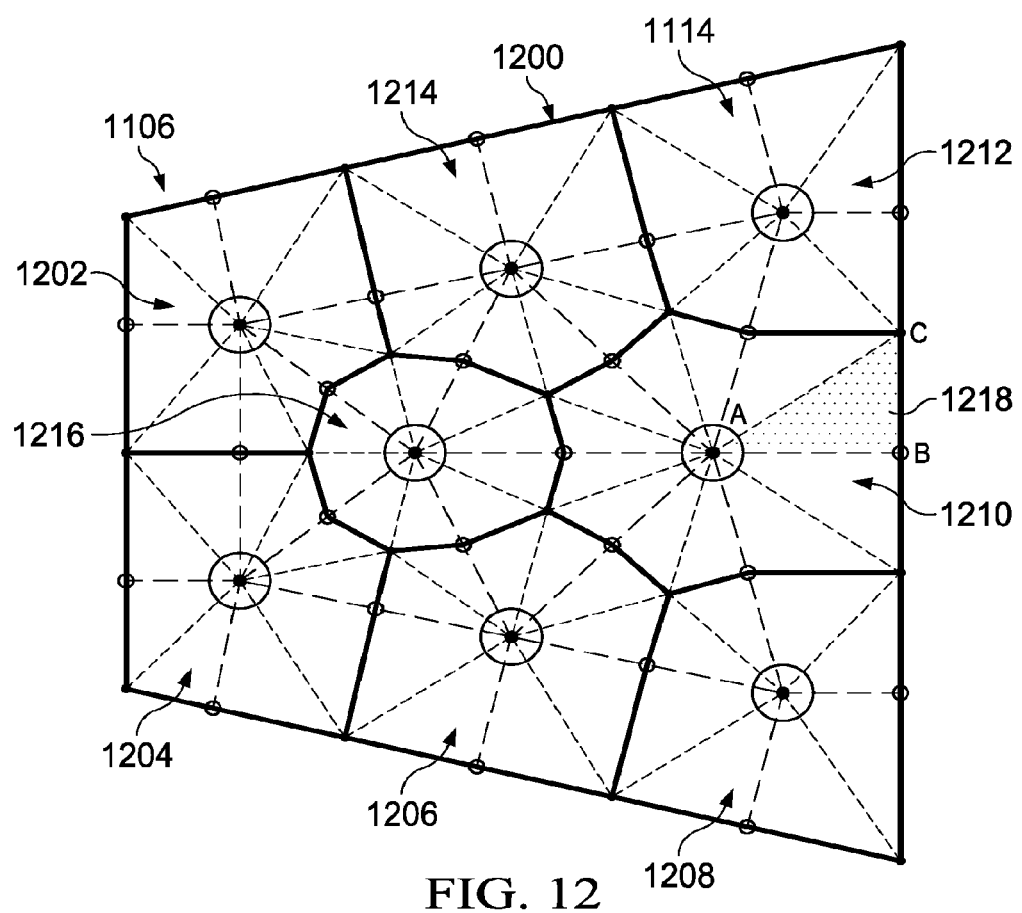
FIG. 12 is an illustration of a division of a two-dimensional model in accordance with an illustrative embodiment.

With reference now to FIG. 12, an illustration of a division of two-dimensional model 1106 from FIG. 11 into sub-regions is depicted in accordance with an illustrative embodiment. In this illustrative example, two-dimensional model 1106 may be divided into plurality of sub-regions 1200. Each of plurality of sub-regions 1200 may correspond to one of plurality of points 341 in FIGS. 3-11, and thus a corresponding one of plurality of fastener devices 103 in FIG. 1.

Plurality of sub-regions 1200 includes sub-regions 1202, 1204, 1206, 1208, 1210, 1212, 1214, and 1216. Sub-regions 1202, 1204, 1206, 1208, 1210, 1212, 1214, and 1216 correspond to points 322, 324, 326, 328, 330, 332, 334, and 336, respectively, in FIGS. 3-11, and thus to fastener devices 104, 106, 108, 110, 112, 114, 116, and 118, respectively, in FIG. 1.

With two-dimensional model 1106 divided into plurality of sub-regions 1200, the portion of bolted joint 100 in FIG. 1 corresponding to one of plurality of sub-regions 1200 may be analyzed independently of or differently than the other sub-regions in plurality of sub-regions 1200. For example, the portion of a mesh generated for one of plurality of sub-regions 1200 may be made denser than the rest of the mesh corresponding to the rest of two-dimensional model 1106.

The manner in which two-dimensional model 1106 is formed allows two-dimensional model 1106 to be easily divided into a plurality of sub-regions 1200, which, in turn, allows the mesh generated using two-dimensional model 1106 to be easily divided into a plurality of sub-modules. Each sub-module of mesh may correspond to a particular sub-region of two-dimensional model 1106. In some illustrative examples, a sub-module may be referred to as a sub-model.

Triangular sector 1218 is an example of one of triangular sectors 1114. Triangular sector 1218 is described in greater detail in FIG. 13 below.

Figure 13:
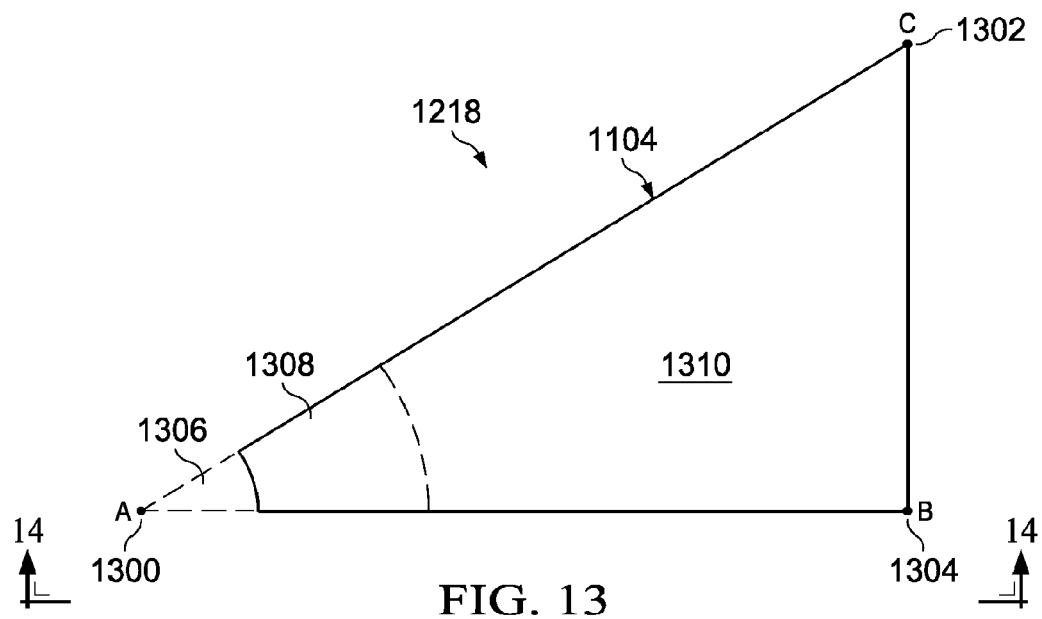
FIG. 13 is an illustration of a triangular sector in accordance with an illustrative embodiment.

With reference now to FIG. 13, an illustration of triangular sector 1218 from FIG. 12 is depicted in accordance with an illustrative embodiment. As depicted, triangular sector 1218 includes first vertex 1300, second vertex 1302, and third vertex 1304. Triangular sector 1218 may be divided into three zones. In particular, triangular sector 1218 may be divided into hole zone 1306, circular zone 1308, and transition zone 1310.

Hole zone 1306 and circular zone 1308 may be portions of triangular sector 1218 that are of interest. The geometry of hole zone 1306 and circular zone 1308 may represent solids of revolution that may be used by a mesh generator, such as mesh generator 208 in FIG. 2, to form a mesh, such as mesh 214 in FIG. 2.

Hole zone 1306 may correspond to the portion of triangular sector 1218 that overlaps with hole 331 from FIG. 3. In this manner, hole zone 1306 may represent a portion of the hole through structure 105 configured to receive fastener device 112 in FIG. 1. Circular zone 1308 may represent a portion of structure 105 located around fastener device 112 in FIG. 1.

Each of triangular sectors 1105 and triangular sectors 1114 in FIG. 11 may be implemented in a manner similar to triangular sector 1218. In other words, each of triangular sectors 1105 and triangular sectors 1114 in FIG. 11 may have a hole zone, a circular zone, and a transition zone similar to hole zone 1306, circular zone 1308, and transition zone 1310, respectively.

Figure 14:
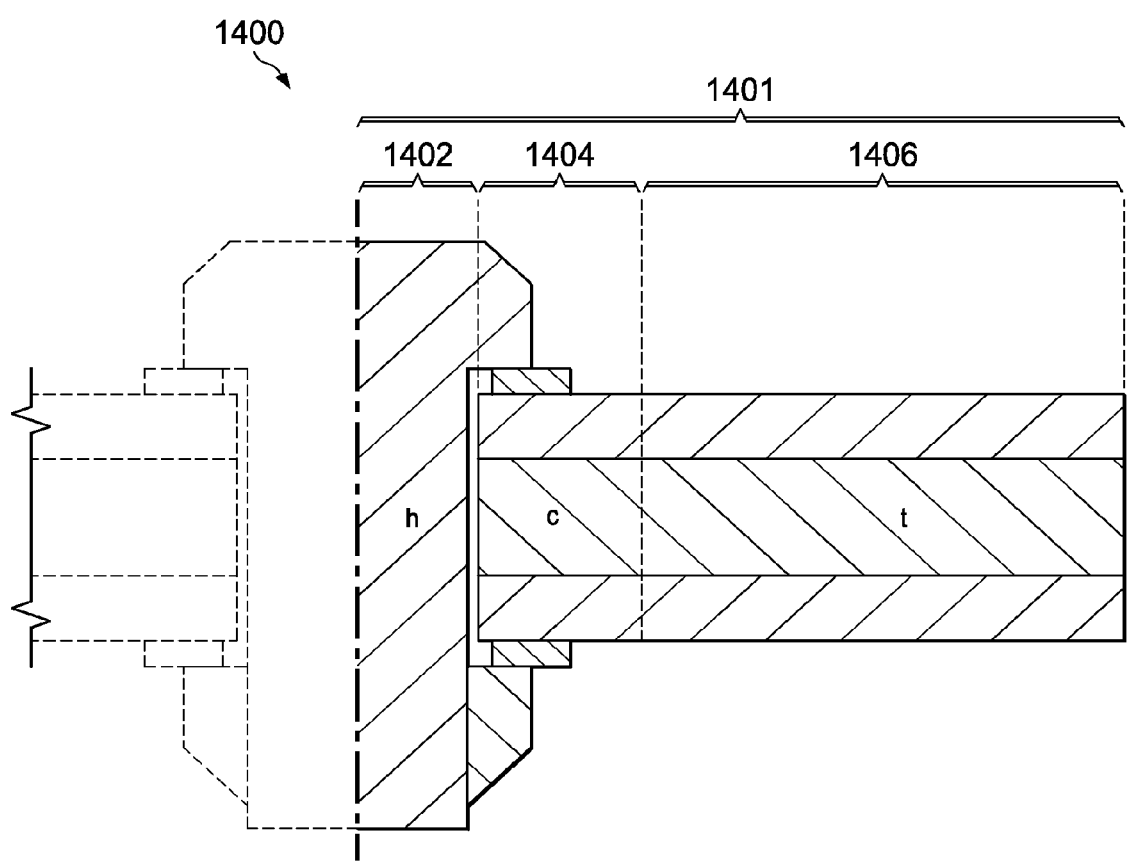
FIG. 14 is an illustration of a side view of a three-dimensional model of a portion of a joint in accordance with an illustrative embodiment.

With reference now to FIG. 14, an illustration of a side view of a three-dimensional model of a portion of a joint is depicted in accordance with an illustrative embodiment. In this illustrative example, a side view of portion 1401 of three-dimensional model 1400 representing bolted joint 100 in FIG. 1 is depicted.

Portion 1401 of three-dimensional model 1400 may be formed based on triangular sector 1218 in FIG. 13. As depicted, hole zone 1306, circular zone 1308, and transition zone 1310 of triangular sector 1218 in FIG. 13 may correspond to hole portion 1402, circular portion 1404, and transition portion 1406 of three-dimensional model 1400.

Figure 15:
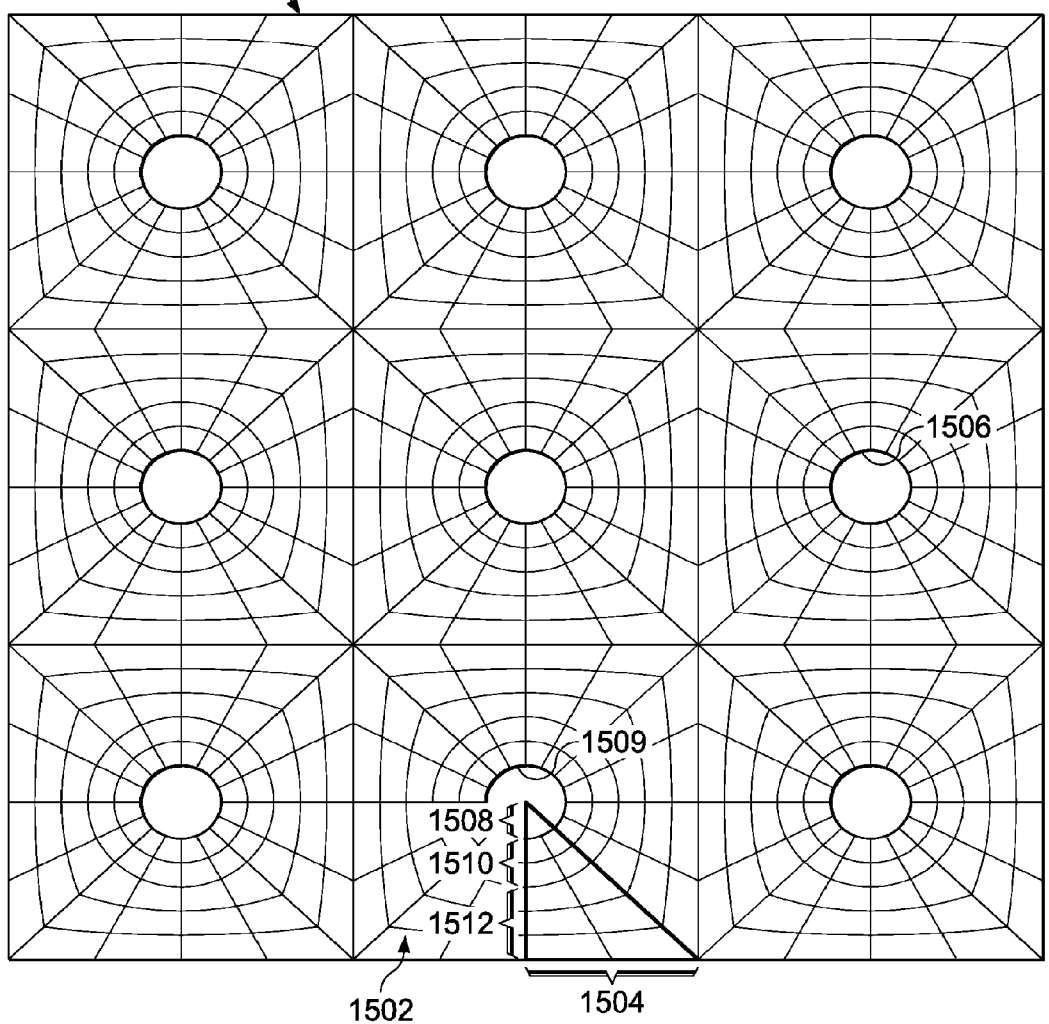
FIG. 15 is an illustration of a plan view of a mesh in accordance with an illustrative embodiment.

With reference now to FIG. 15, an illustration of a plan view of a mesh is depicted in accordance with an illustrative embodiment. In this illustrative example, mesh 1500 may be an example of one implementation for mesh 214 in FIG. 2. Mesh 1500 may be an example of one type of mesh that may be generated based on two-dimensional model 1100 formed in FIG. 11.

In this illustrative example, mesh 1500 is two-dimensional. However, in other illustrative examples, mesh 1500 may be three-dimensional.

As depicted, mesh 1500 is comprised of elements 1502. Elements 1502 may be finite two-dimensional elements in this illustrative example. Each of triangular sectors 1105 in two-dimensional model 1100 in FIG. 11 may be divided into a plurality of quadrilateral shapes based on some selected pattern. As used herein, a "quadrilateral shape" is a four-sided shape. Each side of this four-sided shape may be substantially linear or curved, depending on the implementation. Each of the quadrilateral shapes formed may be a finite element. For example, portion 1504 of mesh 1500 may be the portion created by dividing triangular sectors 1105 in two-dimensional model 1100 of FIG. 11 into a plurality of quadrilateral shapes based on some selected pattern.

As depicted, mesh 1500 has plurality of holes 1506. Plurality of holes 1506 may represent the holes in the first structure configured to receive a plurality of fastener devices. Plurality of holes 1506 may be formed based on the different hole zones of triangular sectors 1105 in FIG. 11.

For example, portion 1508 of hole 1509 in plurality of holes 1506 may correspond to the hole zone of the corresponding triangular sector in two-dimensional model 1100 in FIG. 11. Further, set of elements 1510 in portion 1504 of mesh 1500 may correspond to the circular zone of this corresponding triangular sector. Set of elements 1512 in portion 1504 of mesh 1500 may correspond to the transition zone of the corresponding triangular sector.

Figure 16:
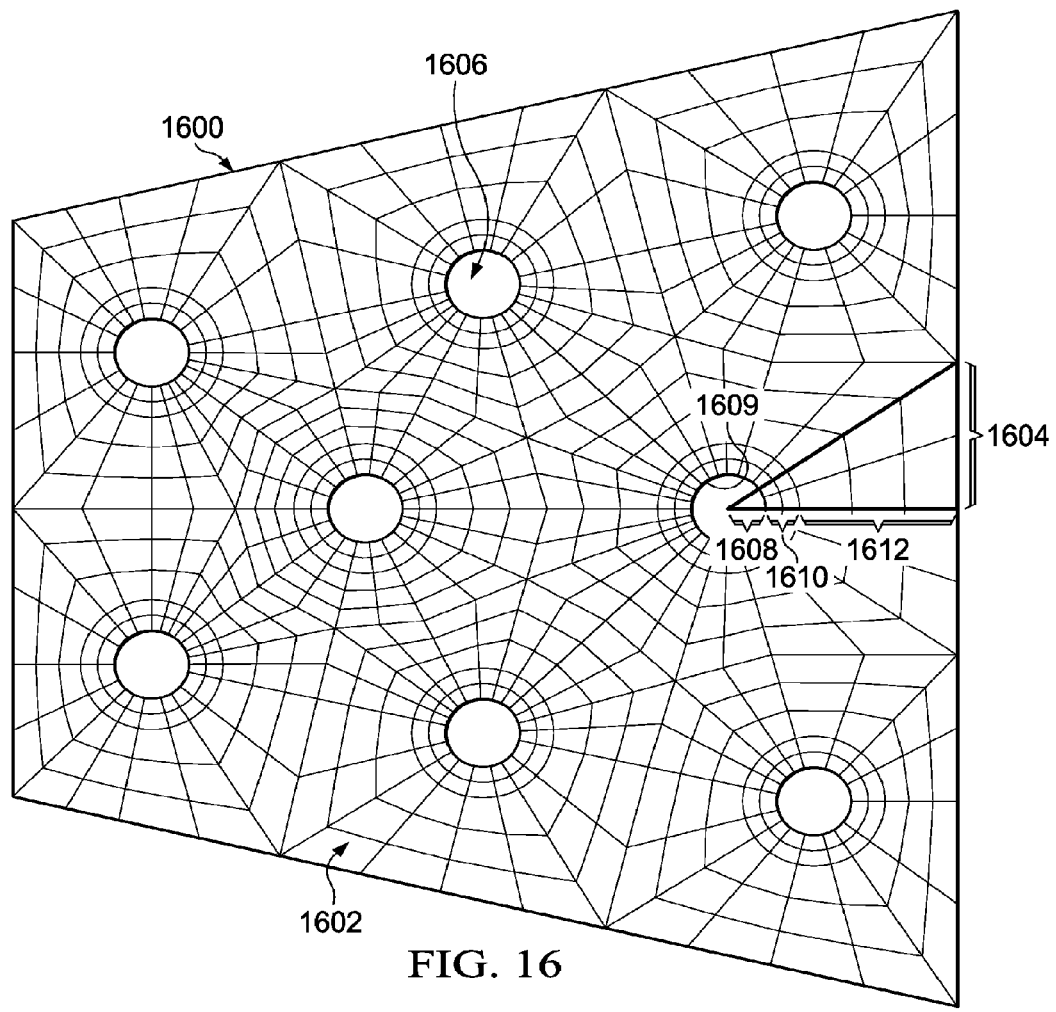
FIG. 16 is an illustration of a plan view of a mesh in accordance with an illustrative embodiment.

With reference now to FIG. 16, an illustration of a plan view of a mesh is depicted in accordance with an illustrative embodiment. In this illustrative example, mesh 1600 may be an example of one implementation for mesh 214 in FIG. 2. Mesh 1600 may be generated based on two-dimensional model 1106 formed in FIG. 11.

In this illustrative example, mesh 1600 is two-dimensional. However, in other illustrative examples, mesh 1600 may be three-dimensional.

As depicted, mesh 1600 is comprised of elements 1602. Elements 1602 may be finite two-dimensional elements in this illustrative example. Each of triangular sectors 1114 in two-dimensional model 1106 in FIG. 11 may be divided into a plurality of quadrilateral shapes based on some selected pattern. Each quadrilateral shape is a finite element. For example, portion 1604 of mesh 1600 may be the portion created by dividing triangular sector 1218 in FIGS. 12-13 from triangular sectors 1114 in two-dimensional model 1100 of FIG. 11 into a plurality of quadrilateral shapes based on some selected pattern.

Further, mesh 1600 has plurality of holes 1606. Plurality of holes 1606 may represent the holes in structure 105 in FIG. 1 configured to receive plurality of fastener devices 103 in FIG. 1. Plurality of holes 1606 may be formed based on the different hole zones of triangular sectors 1114 in FIG. 11.

For example, portion 1608 of hole 1609 in plurality of holes 1606 may correspond to hole zone 1306 of triangular sector 1218 in FIG. 13. Hole 1609 may correspond to hole 331 in FIG. 3, which may, in turn, correspond to the hole in structure 105 in FIG. 1 configured to receive fastener device 112 in FIG. 1.

Further, set of elements 1610 in portion 1604 of mesh 1600 may correspond to circular zone 1308 of triangular sector 1218 in FIG. 13. Set of elements 1612 in portion 1604 of mesh 1600 may correspond to transition zone 1310 of triangular sector 1218 in FIG. 13.

Figure 17:
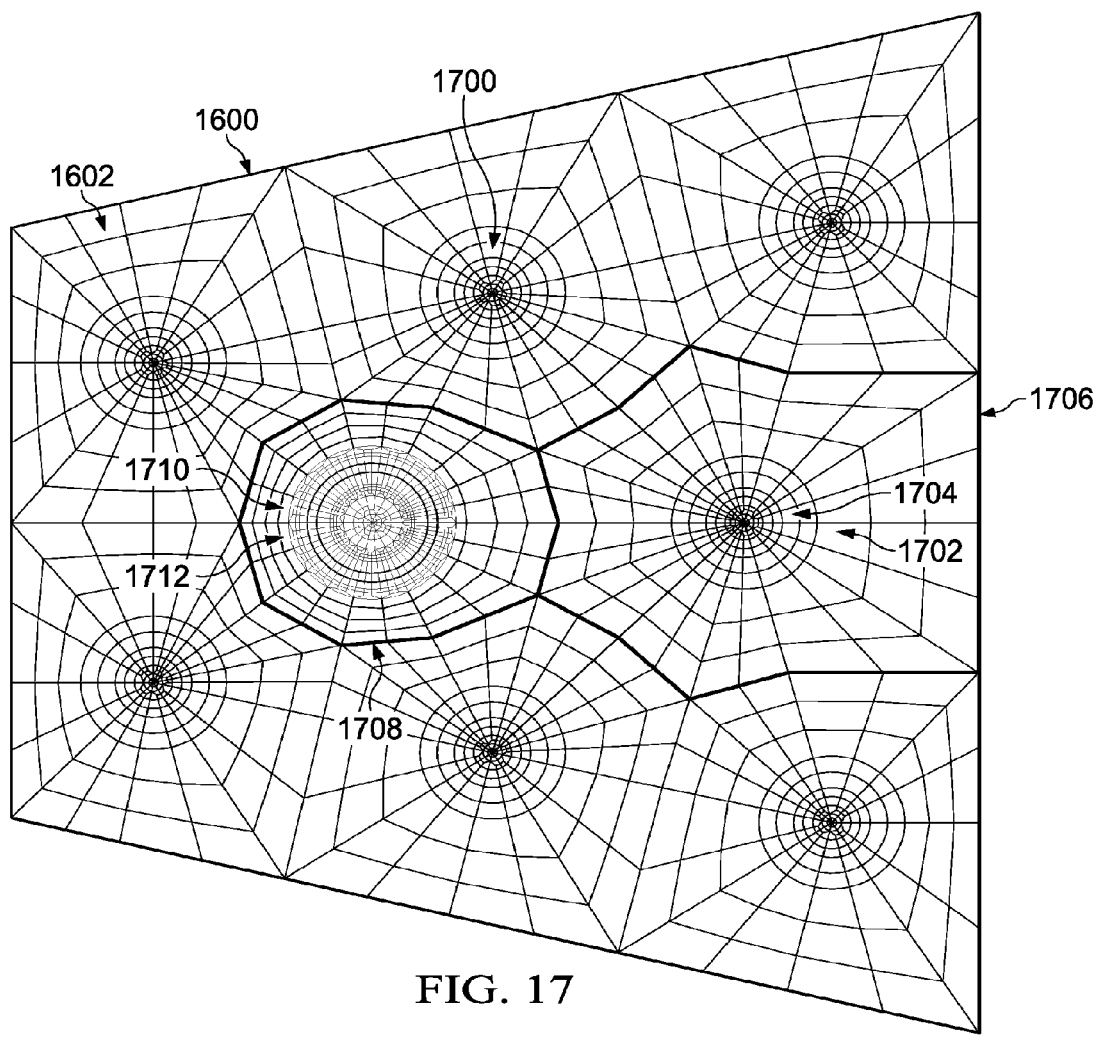
FIG. 17 is an illustration of a plan view of a mesh in accordance with an illustrative embodiment.

With reference now to FIG. 17, an illustration of mesh 1600 from FIG. 16 having plurality of holes 1606 from FIG. 16 filled with a plurality of fastener portions is depicted in accordance with an illustrative embodiment. In this illustrative example, plurality of holes 1606 from FIG. 16 has been filled with plurality of fastener portions 1700.

A fastener portion in plurality of fastener portions 1700 may be a portion of mesh 1600 that comprises finite solid elements that represent a fastener device configured to be installed in the corresponding hole of plurality of holes 1606 in FIG. 16.

For example, fastener portion 1702 may be an example of one of plurality of fastener portions 1700. Fastener portion 1702 may include fastener elements 1704. Fastener elements 1704 may include finite solid elements used to represent a fastener device.

As depicted, fastener portion 1702 is located within module 1706 of mesh 1600. As used herein, a "module" of a mesh is a portion of the mesh that corresponds to a sub-region identified in the two-dimensional model from which the mesh was generated. For example, module 1706 is the portion of mesh 1600 that corresponds to sub-region 1216 of two-dimensional model 1106 in FIG. 12.

By identifying a module in mesh 1600 that corresponds to one of plurality of sub-regions 1200 of two-dimensional model 1106 in FIG. 12, the module may be analyzed independently of or differently than the rest of mesh 1600. For example, the density of finite elements in a first module may be increased as compared to the density of finite elements in a second module. The increased density of the first module may allow the results of the finite element analysis performed for the first module to have a greater level of detail and accuracy as compared to the results for the second module.

For example, the density of finite elements in module 1708 has been increased as compared to the density of finite elements in module 1706. Module 1708 includes fastener portion 1710. Fastener portion 1710 includes fastener elements 1712.

Figure 18:
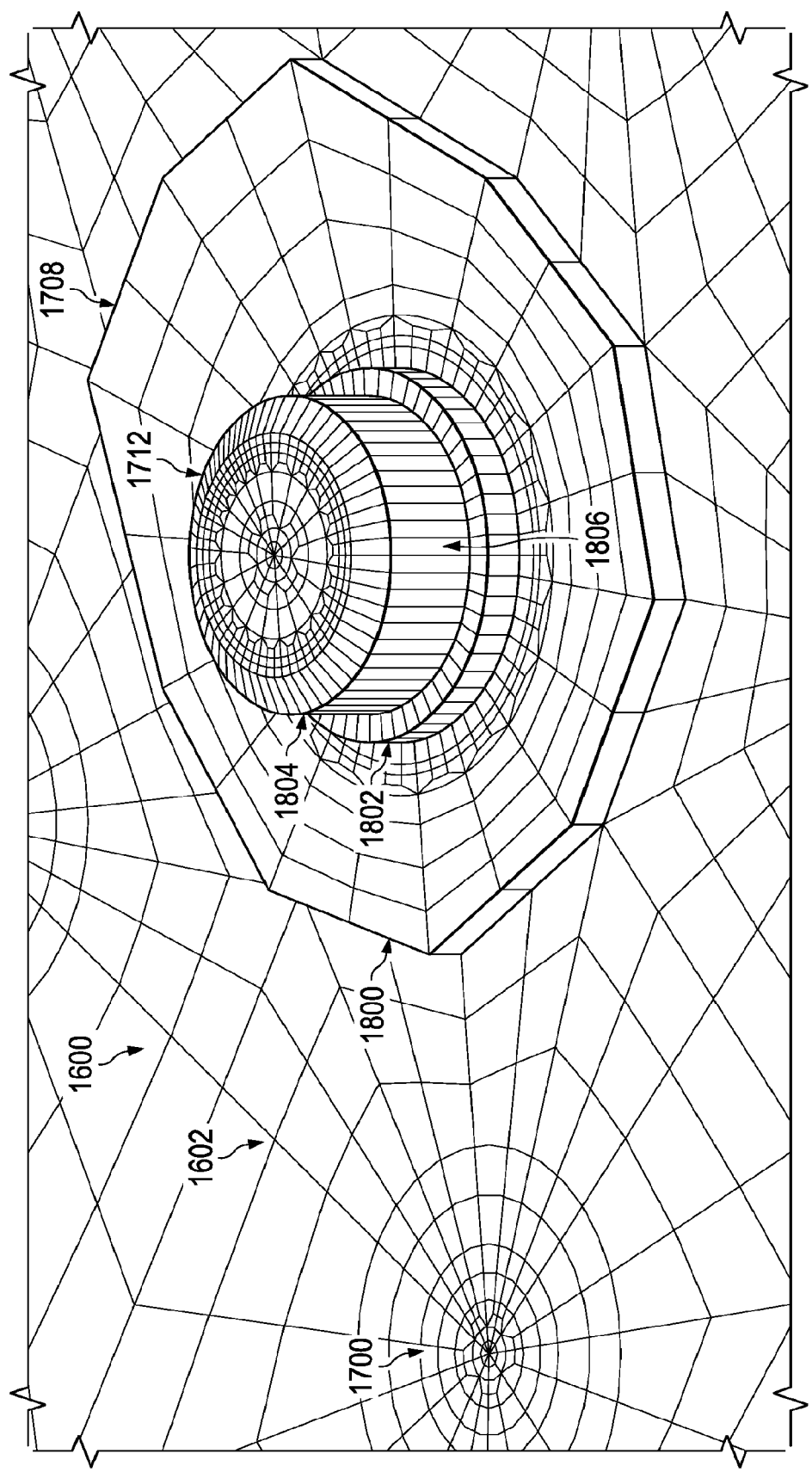
FIG. 18 is an illustration of an isometric view of mesh in accordance with an illustrative embodiment.

With reference now to FIG. 18, an illustration of an isometric view of mesh 1600 from FIG. 17 with module 1708 made three-dimensional is depicted in accordance with an illustrative embodiment. In this illustrative example, module 1708 from FIG. 17 has been converted into a three-dimensional module.

As depicted, module 1708 now has layers 1800, 1802, and 1804 that are three-dimensional. In other words, the finite elements of these layers are finite solid elements. As depicted, module 1708 has density 1806.

Figure 19:
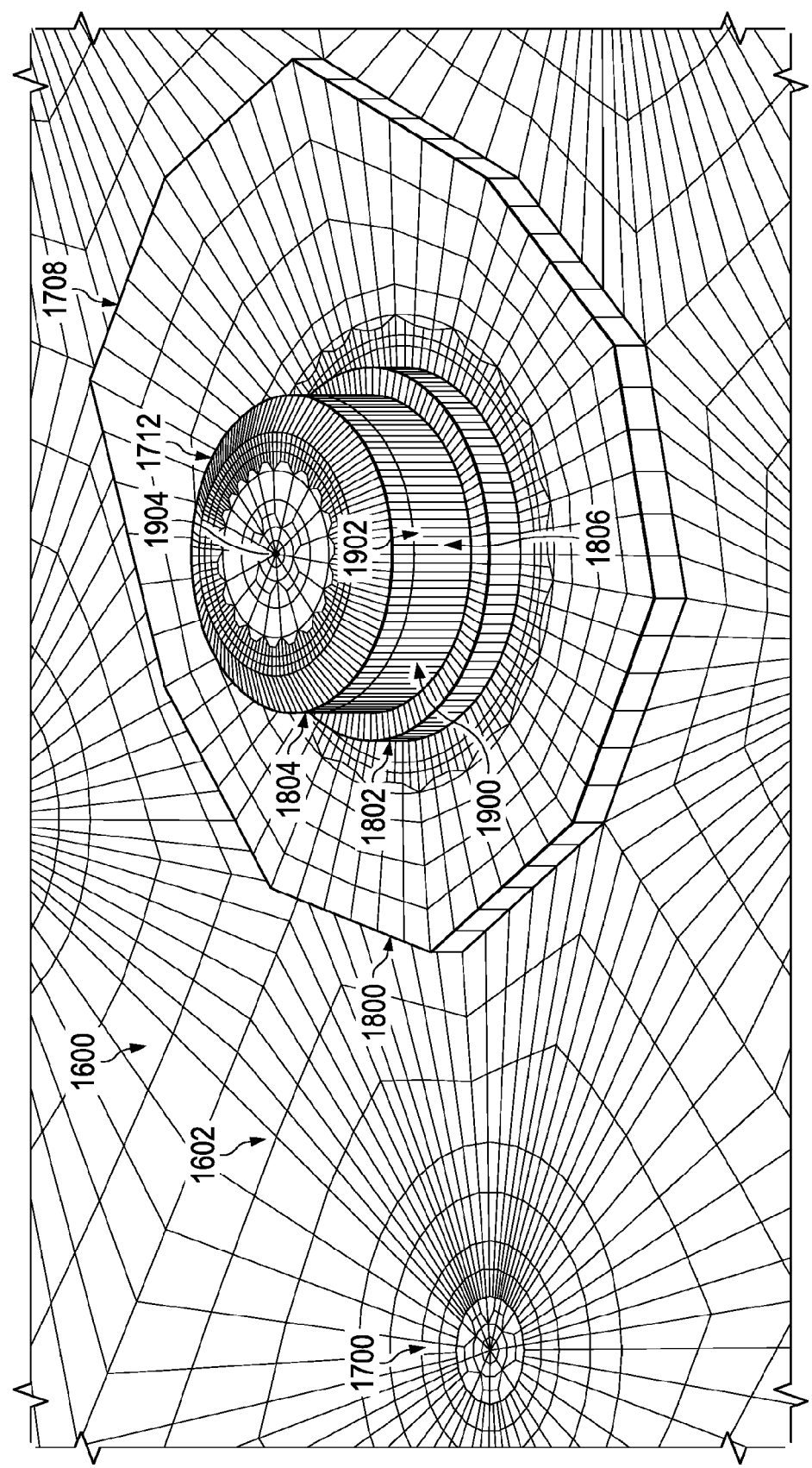
FIG. 19 is an illustration of a module in accordance with an illustrative embodiment.

With reference now to FIG. 19, an illustration of module 1708 from FIG. 18 with an even greater density is depicted in accordance with an illustrative embodiment. As depicted, module 1708 has density 1900 in FIG. 19. Density 1900 may be greater than density 1806 in FIG. 18.

Radial divisions 1902 have been added to module 1708 to increase the density of module 1708 to density 1900. Radial divisions 1902 are divisions that extend from center 1904 of module 1708 to further divide the finite solid elements that make up module 1708. Center 1904 of module 1708 may be the center of fastener portion 1710.

Figure 20:
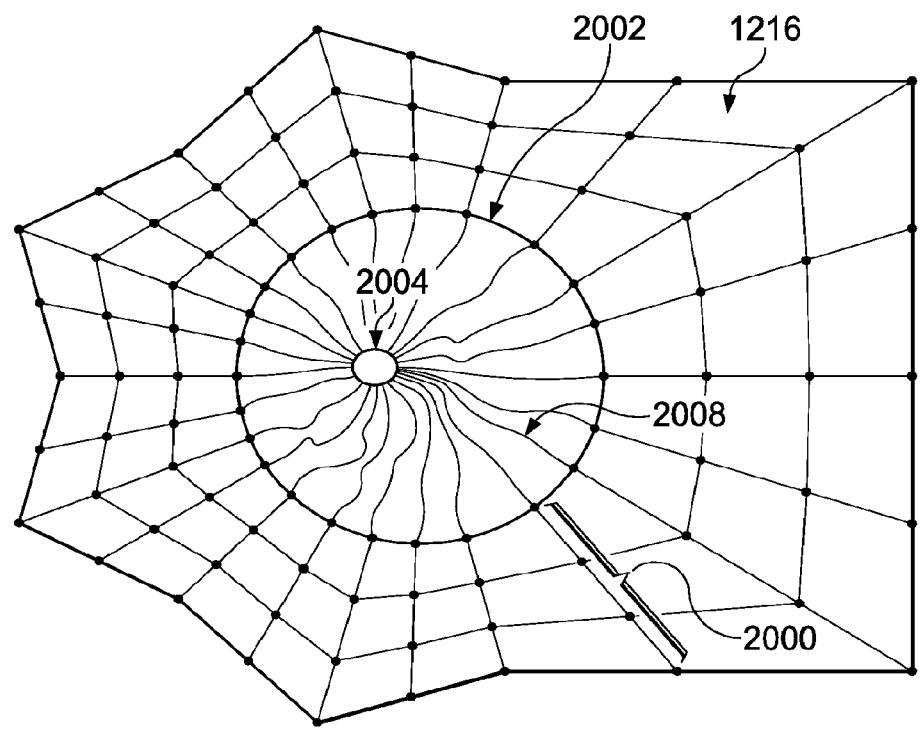
FIG. 20 is an illustration of a sub-region of a two-dimensional model in accordance with an illustrative embodiment.

With reference now to FIG. 20, an illustration of sub-region 1216 of two-dimensional model 1106 from FIG. 12 is depicted in accordance with an illustrative embodiment. In this illustrative example, sub-region 1216 has transition area 2000 formed by the transition zones of the portion of triangular sectors 1114 from FIG. 11 included in sub-region 1216.

As depicted, fastener boundary 2002 may be the boundary formed between transition area 2000 and the circular zones of the portion of triangular sectors 1114 from FIG. 11 included in sub-region 1216. Fastener boundary 2002 defines the outer circumference of the particular fastener device that would be installed in the portion of the joint represented by two-dimensional model 1106.

General area 2008 is the portion of sub-region 1216 within fastener boundary 2002. As depicted, general element 2004 is located within general area 2008. General element 2004 may represent a reduced stiffness matrix and load vector for which the finite element model degrees of freedom have been removed, retaining only the degrees of freedom associated with fastener boundary 2002. In one illustrative example, the portion of triangular sectors 1114 from FIGS. 11-12 located within sub-region 1216 may be stored in computer memory.

Figure 21:
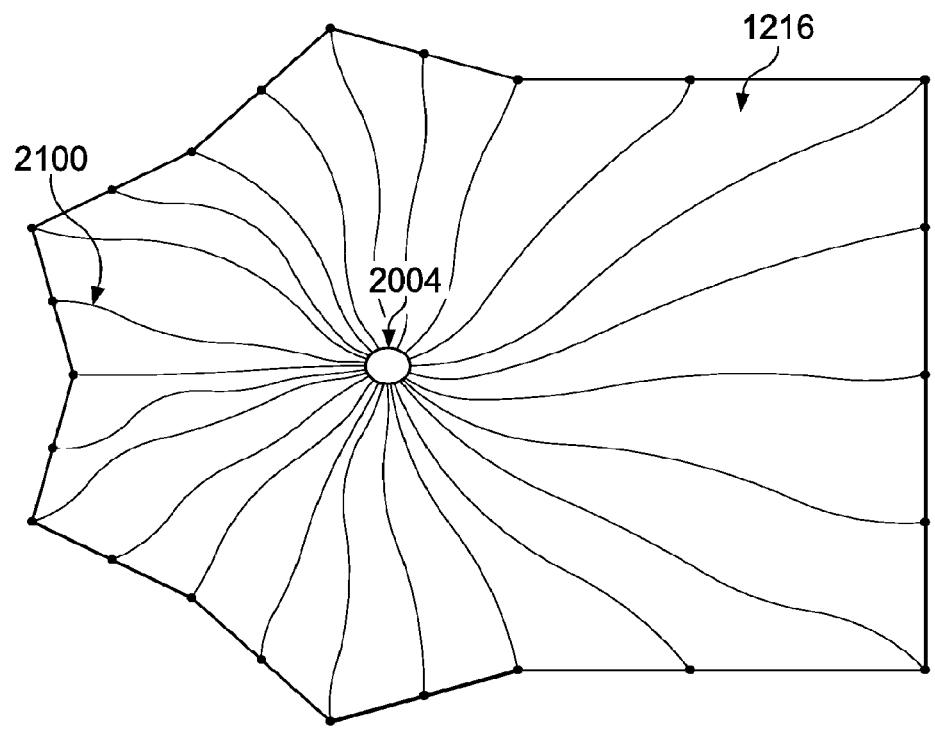
FIG. 21 is an illustration of a sub-region of a two-dimensional model in accordance with an illustrative embodiment.

With reference now to FIG. 21, an illustration of sub-region 1216 of two-dimensional model 1106 from FIG. 12 is depicted in accordance with an illustrative embodiment. In this illustrative example, general area 2100 may be formed by all of sub-region 1216.

Subdivision of a finite element model into sub-models also makes it possible to more easily and conveniently make use of sub-structuring in the finite element analysis. In sub-structuring, the stiffness matrices of the sub-structures can be triangularized and stored in computer memory. Only the degrees of freedom associated with the boundaries between adjacent substructures need to be solved when a structure is analyzed. Further, only the stiffness matrix of the altered part of the finite element model requires triangularization because it was changed.

For example, if a modeling change has been made to a sub-region in plurality of sub-regions 1200 in FIG. 12 other than sub-region 1216 shown in FIG. 21, the stiffness matrix and stress recovery matrices associated with general element 2004 will not need to be modified. Further, if the geometry represented by sub-region 1216 is changed, only general element 2004 associated with sub-region 1216 will need to be regenerated. The stiffness matrices or displacement recovery matrices associated with the other sub-regions in plurality of sub-regions 1200 in FIG. 12 will not need to be regenerated or modified. This type of process may be referred to as sub-structuring and is similar to a process called static condensation.

Thus, if all of the sub-regions of a finite element model are modeled with general elements, the only degrees of freedom left un-reduced are the degrees of freedom associated with the nodes siting on the boundaries between all of the sub-regions. This number of boundary nodes is typically fewer than the number of nodes in the entire finite element model, and thus much quicker to solve. This allows changes to be made to one sub-region, with subsequent factorization of the stiffness matrix associated with that sub-region, thus allowing the solution of the stiffness matrix for the model to be quickly obtained.

With reference now to FIGS. 22-25, an illustration of a process for identifying a plurality of nearest neighbors for a point is depicted in accordance with an illustrative embodiment. This process may be an example of one manner in which the nearest neighbors for each of plurality of points 301 in first region 300 and each of plurality of points 341 in second region 302 may be identified, as described in FIG. 4, by a graph generator, such as graph generator 220 in FIG. 2.

The process in FIGS. 22-25 is described with respect to identifying a plurality of nearest neighbors for point 322 in plurality of points 341 within second region 302. This process may be repeated for each of plurality of points 341.

Figure 22:
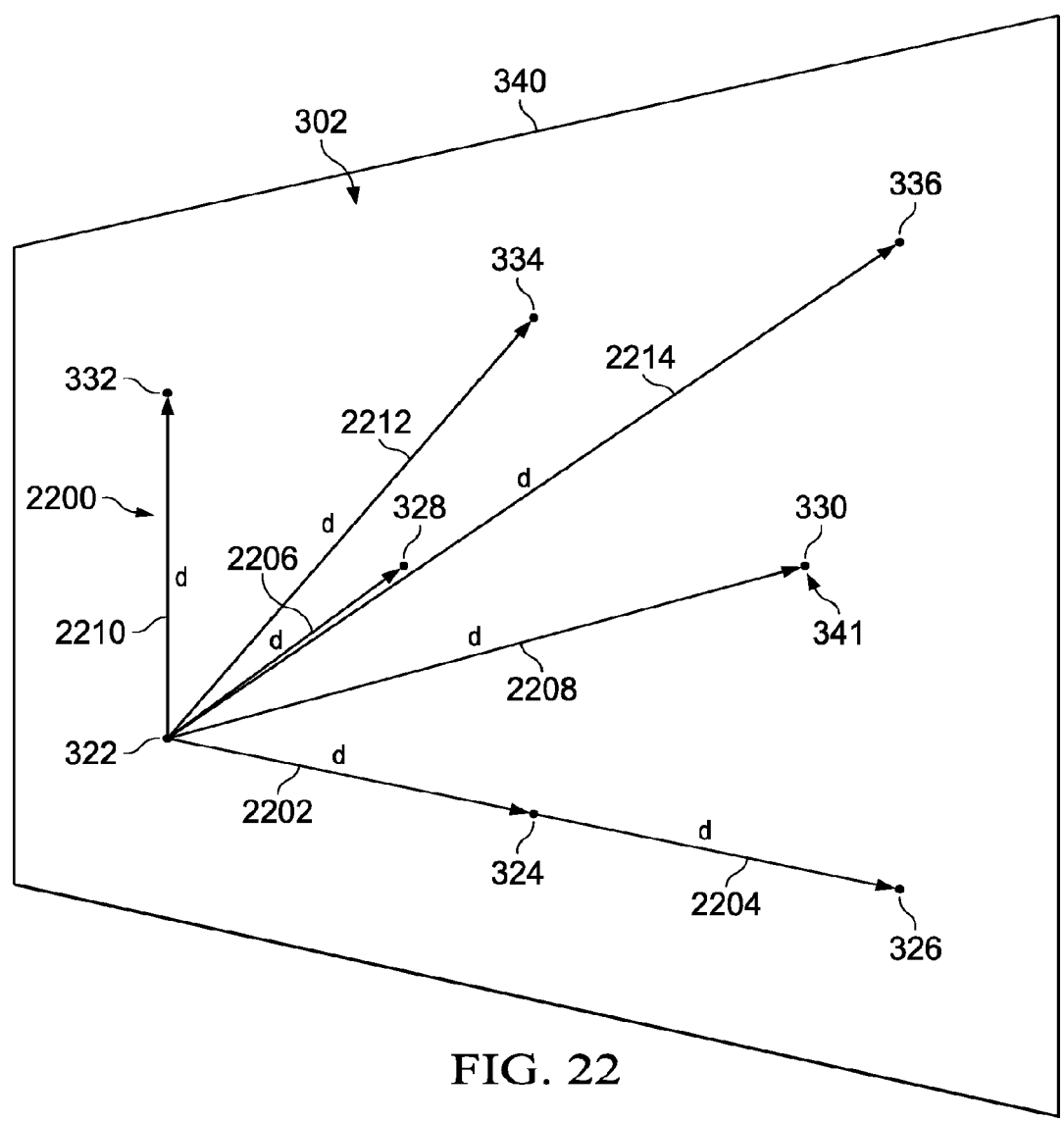
FIG. 22 is an illustration of the step of identifying distances between a point and each of the plurality of points in accordance with an illustrative embodiment.

Turning now to FIG. 22, an illustration of the step of identifying distances between point 322 and each of plurality of points 341 is depicted in accordance with an illustrative embodiment. In this illustrative example, a distance from point 322 to each of plurality of points 341 is identified to form plurality of distances 2200.

Plurality of distances 2200 include distances 2202, 2204, 2206, 2208, 2210, 2212, and 2214. Distance 2202 is the distance between point 322 and point 324. Distance 2204 is the distance between point 322 and point 326. Distance 2206 is the distance between point 322 and point 328. Distance 2208 is the distance between point 322 and point 330. Distance 2210 is the distance between point 322 and point 332. Distance 2212 is the distance between point 322 and point 334. Distance 2214 is the distance between point 322 and point 336.

Figure 23:
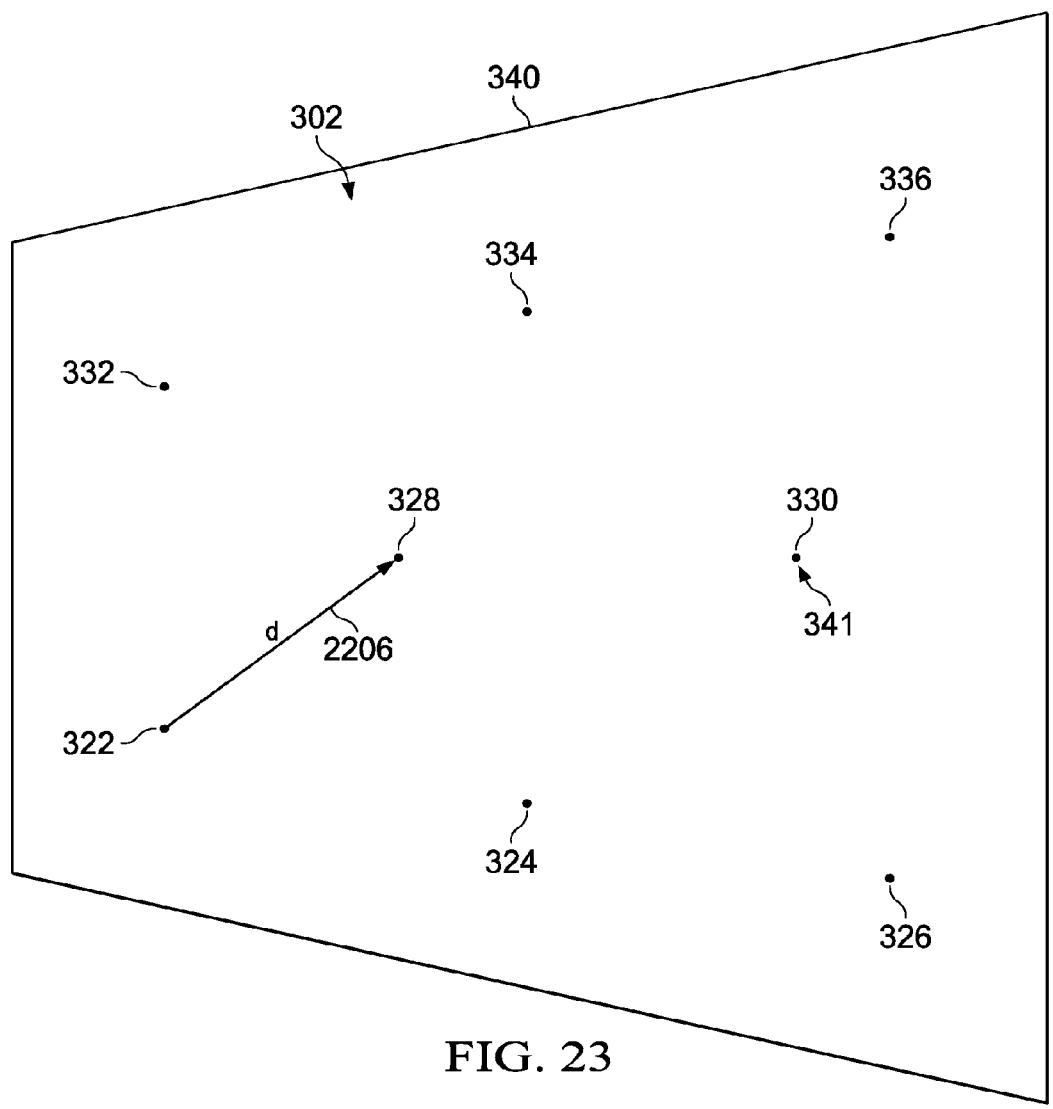
FIG. 23 is an illustration of the step of identifying a first nearest potential neighbor of a point in accordance with an illustrative embodiment.

With reference now to FIG. 23, an illustration of the step of identifying a first nearest potential neighbor of point 322 is depicted in accordance with an illustrative embodiment. In this illustrative example, the distances in plurality of distances 2200 in FIG. 22 may be ordered in ascending order.

Based on this order, the shortest distance may be identified. In this illustrative example, distance 2206 between point 322 and point 328 is the shortest distance between point 322 and any of plurality of points 341. Thus, point 328 may be identified as the first potential nearest neighbor of point 322.

Figure 24:
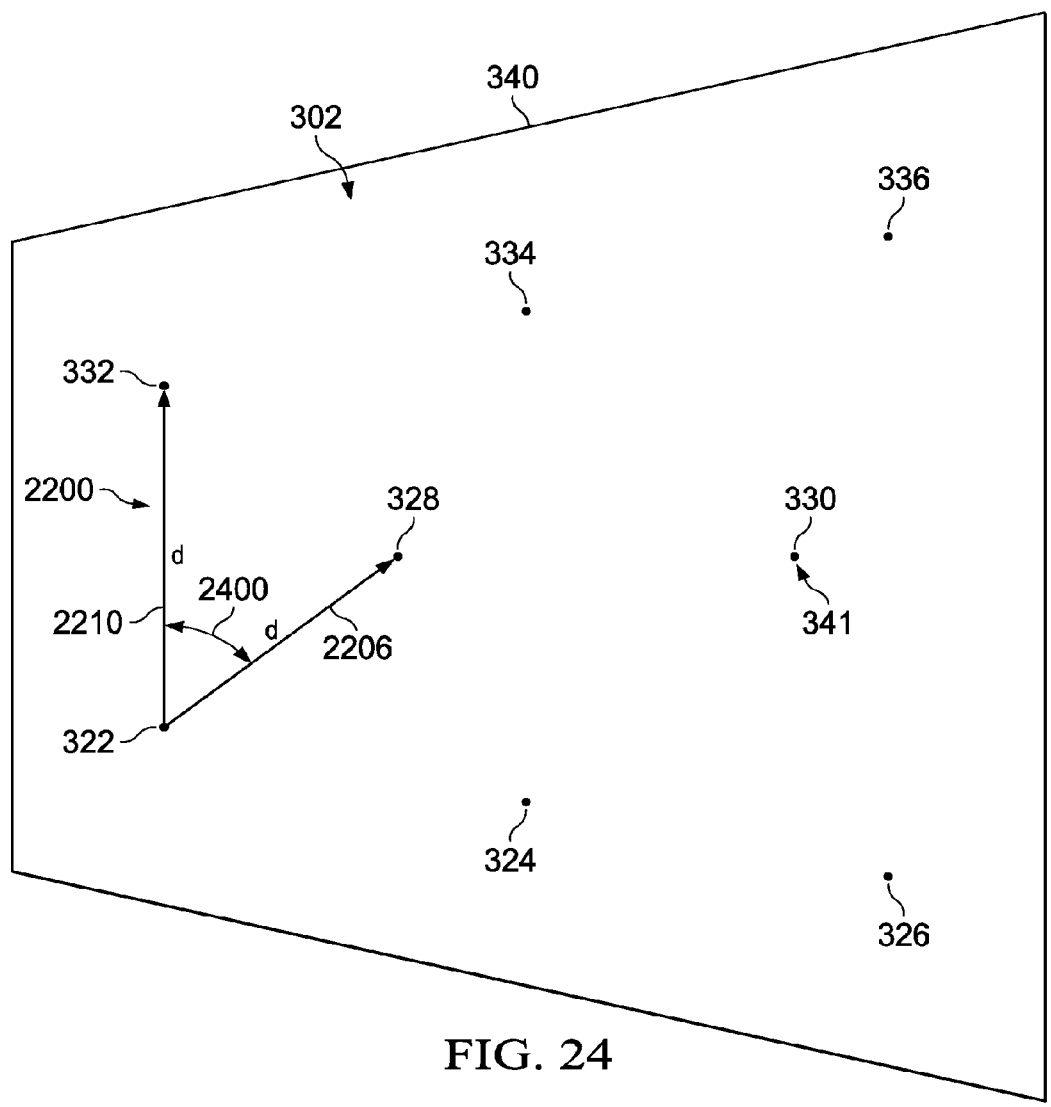
FIG. 24 is an illustration of the step of identifying a second potential nearest neighbor for a point in accordance with an illustrative embodiment.

With reference now to FIG. 24, an illustration of the step of identifying a second potential nearest neighbor for point 322 is depicted in accordance with an illustrative embodiment. In this illustrative example, the second shortest distance in plurality of distances 2200 from FIG. 22 is identified as distance 2210 between point 322 and point 332.

Before point 322 can be identified as the second potential nearest neighbor of point 322, angle 2400 between point 328 and 332 with respect to point 322 needs to be compared to a first evaluation angle. The first evaluation angle may be selected as an angle between the range of about 10 degrees and about 80 degrees. In this illustrative example, the first evaluation angle may be selected as about 50 degrees.

If angle 2400 is greater than the first evaluation angle, point 332 may be identified as the second potential nearest neighbor of point 322. However, if angle 2400 is equal to or less than the first evaluation angle, point 332 is no longer considered a potential nearest neighbor of point 322. In this illustrative example, angle 2400 is greater than about 50 degrees. Thus, point 332 is identified as the second potential nearest neighbor.

Figure 25:
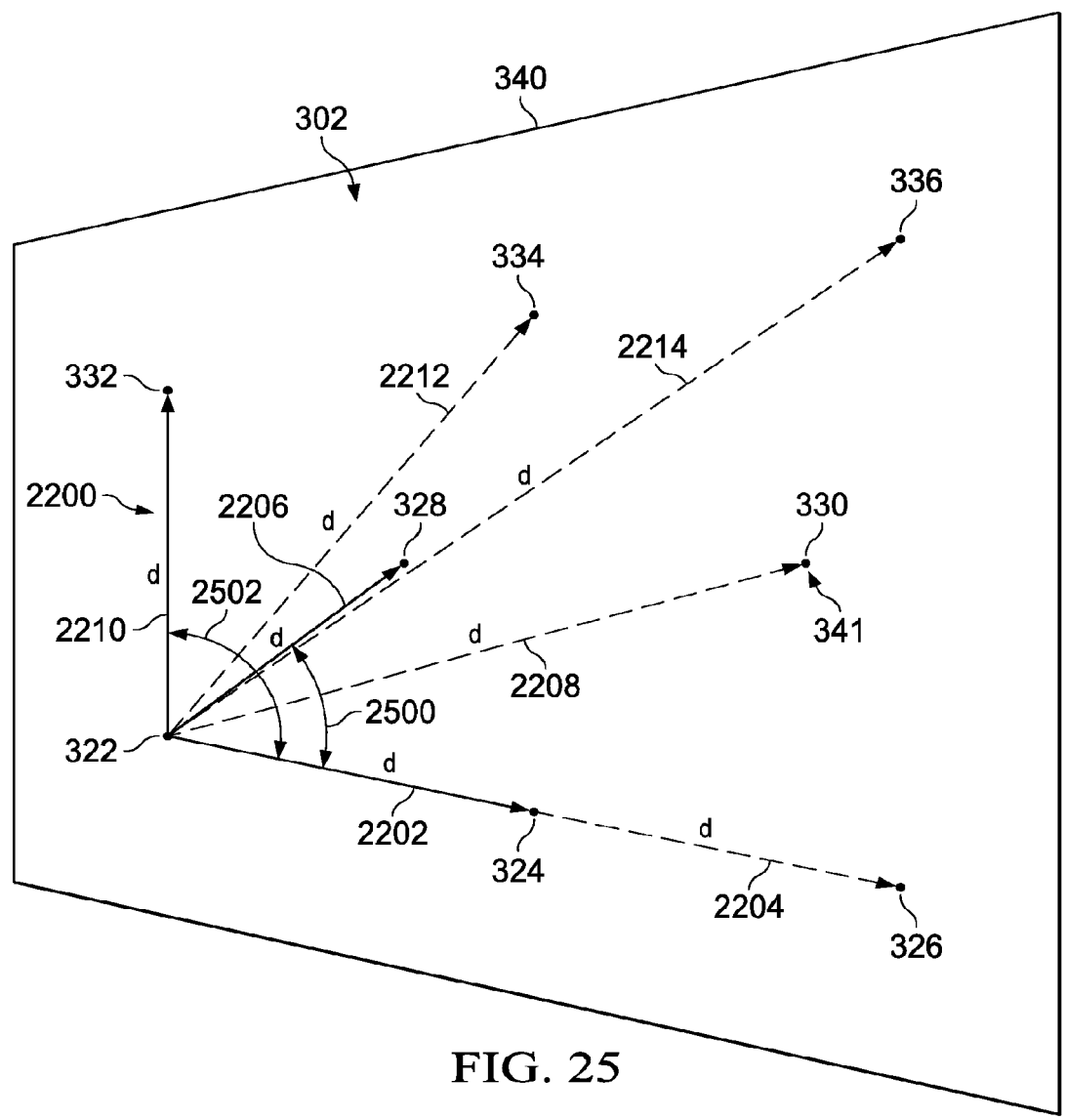
FIG. 25 is an illustration of the step of identifying the rest of the potential nearest neighbors for a point in accordance with an illustrative embodiment.

With reference now to FIG. 25, an illustration of the step of identifying the rest of the potential nearest neighbors for point 322 is depicted in accordance with an illustrative embodiment. In this illustrative example, distance 2202 between point 322 and point 324 is identified as the third short distance in plurality of distances 2200 in FIG. 22.

In order for point 324 to be identified as the third potential nearest neighbor of point 322, the angle between point 324 and each of the other potential nearest neighbors identified must be greater than the first evaluation angle. Angle 2500 is the angle between point 324 and point 328 with respect to point 322. Angle 2502 is the angle between point 324 and point 332 with respect to point 322. Angle 2500 and angle 2502 are greater than the first evaluation angle. Thus, point 324 is identified as the third nearest neighbor of point 322.

In a similar manner, each of the other distances in plurality of distances 2200 may be evaluated. In this illustrative example, no other point may meet the criteria of having each angle between the point and the other potential nearest neighbors with respect to point 322 greater than the first evaluation angle. Thus, point 324, point 328, and point 332 may be the only potential nearest neighbors for point 322.

The process described in FIGS. 22-25 may be repeated for the rest of the points in plurality of points 301. In particular, this process may be repeated for point 324, point 326, point 328, point 330, point 332, point 334, and point 336 to find the potential nearest neighbors of each of these points.

For example, point 328 may be evaluated to identify the potential nearest neighbors of point 328 using a process similar to the one described in FIGS. 22-25. If point 322 is identified as a potential nearest neighbor for point 328, then point 328 is considered a mutual nearest neighbor of point 322. Point 322 and point 328 may be referred to as mutual nearest neighbors. The final plurality of nearest neighbors identified for point 322 may only include points that are mutual nearest neighbors of point 322.

Figure 26:
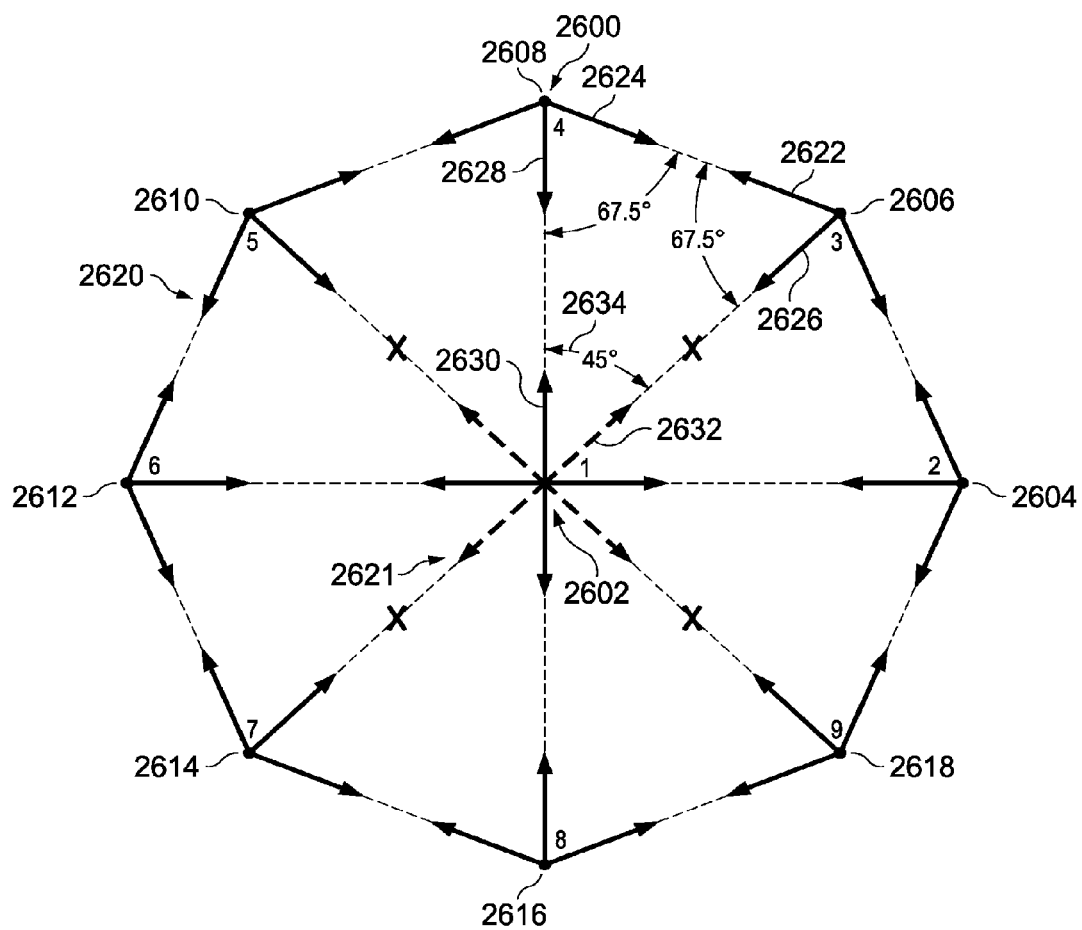
FIG. 26 is an illustration of a plurality of points and potential nearest neighbors in accordance with an illustrative embodiment.

With reference now to FIG. 26, an illustration of a plurality of points and potential nearest neighbors is depicted in accordance with an illustrative embodiment. In this illustrative example, plurality of points 2600 includes points 2602, 2604, 2606, 2608, 2610, 2612, 2614, 2616, and 2618.

As depicted, neighbor arrows 2620 and non-neighbor arrows 2621 are depicted between plurality of points 2600. A neighbor arrow pointed in a direction from a first point to a second point may indicate that the second point is a potential nearest neighbor of the first point. For example, neighbor arrow 2622 indicates that point 2608 is a potential nearest neighbor of point 2606.

Two points having neighbor arrows that point at each other indicates that the two points are mutual nearest neighbors. For example, neighbor arrow 2624 indicates that point 2606 is a potential nearest neighbor of point 2608. Thus, point 2608 and point 2606 are mutual nearest neighbors.

Further, neighbor arrow 2626 indicates that point 2602 is a potential nearest neighbor of point 2606. Neighbor arrow 2628 indicates that point 2602 is a potential nearest neighbor of point 2608. Further, neighbor arrow 2630 indicates that point 2608 is a potential nearest neighbor of point 2602 such that point 2602 and point 2608 are mutual nearest neighbors.

However, non-neighbor arrow 2632 indicates that point 2606 was not identified as a potential nearest neighbor of point 2602. Thus, point 2602 and point 2606 may be non-mutual nearest neighbors. In some cases, it may be desirable to re-evaluate point 2606 with respect to point 2602 such that point 2606 may be included as a final nearest neighbor of point 2602.

For example, a second evaluation angle may be used to re-evaluate point 2602. The second evaluation angle may be selected as an angle less than the first evaluation angle. In this illustrative example, the second evaluation angle may be selected as about 22 degrees.

The angle between point 2606 and every mutual nearest neighbor of point 2602 with respect to point 2602 may be compared to the second evaluation angle. If the angle is greater than the second evaluation angle, then point 2606 may be identified as a mutual nearest neighbor of point 2602. If the angle is equal to or less than the second evaluation angle, then point 2606 is removed from consideration as a final nearest neighbor for point 2602. Further, point 2602 is removed from consideration as a final nearest neighbor for point 2606.

For example, point 2608 may be a mutual nearest neighbor of point 2602. Angle 2634 is the angle between point 2606 and point 2608 with respect to point 2602. Angle 2634 is less than the first evaluation angle of about 50 degrees. However, angle 2634 is greater than the second evaluation angle of about 22 degrees. If the angle between point 2606 and every other mutual nearest neighbor of point 2602 with respect to point 2602 is greater than the second evaluation angle, then point 2606 may be considered a mutual nearest neighbor of point 2602.

Figure 27:
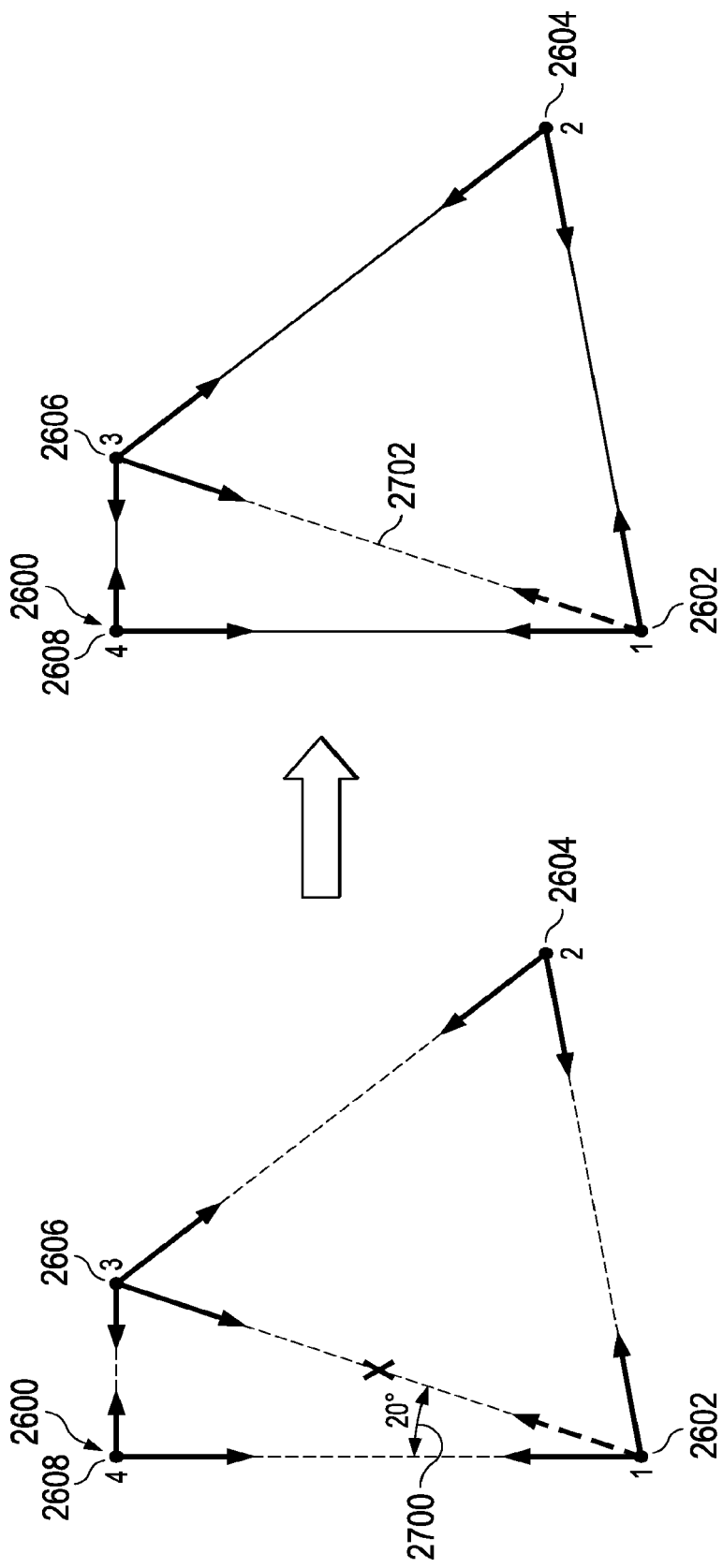
FIG. 27 is an illustration of a portion of a plurality of points in different locations relative to the other in accordance with an illustrative embodiment.

With reference now to FIG. 27, an illustration of a portion of plurality of points 2600 from FIG. 26 in different locations relative to the other is depicted in accordance with an illustrative embodiment. In this illustrative example, only points 2602, 2604, 2606, and 2608 are depicted.

In some cases, the angle between point 2606 and point 2608 with respect to point 2602 has changed from angle 2634 in FIG. 26 to angle 2700 in FIG. 27. Angle 2634 is about 20 degrees, which is less than the second evaluation angle. Thus, point 2606 may not be considered a mutual nearest neighbor of point 2602. As a result, point 2606 is removed from consideration as a final nearest neighbor for point 2602 and point 2602 is removed from consideration as a final nearest neighbor for point 2606, as indicated by dashed line 2702.

Figure 28A:
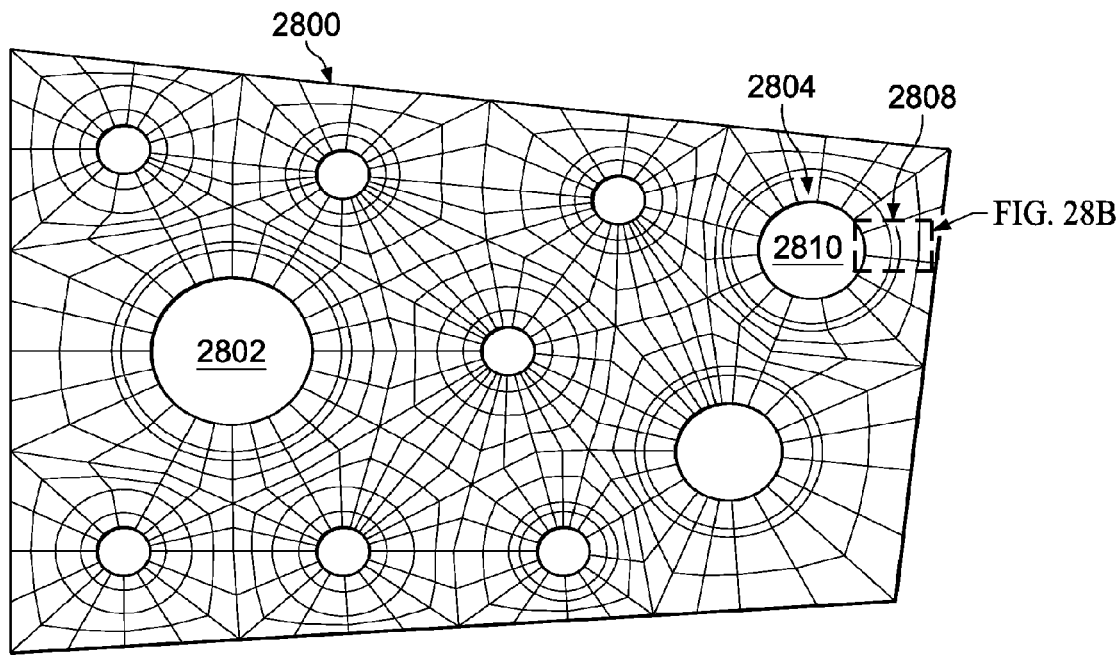
FIGS. 28A and 28B are an illustration of a mesh having a first level of detail in accordance with an illustrative embodiment.
Figure 28B:
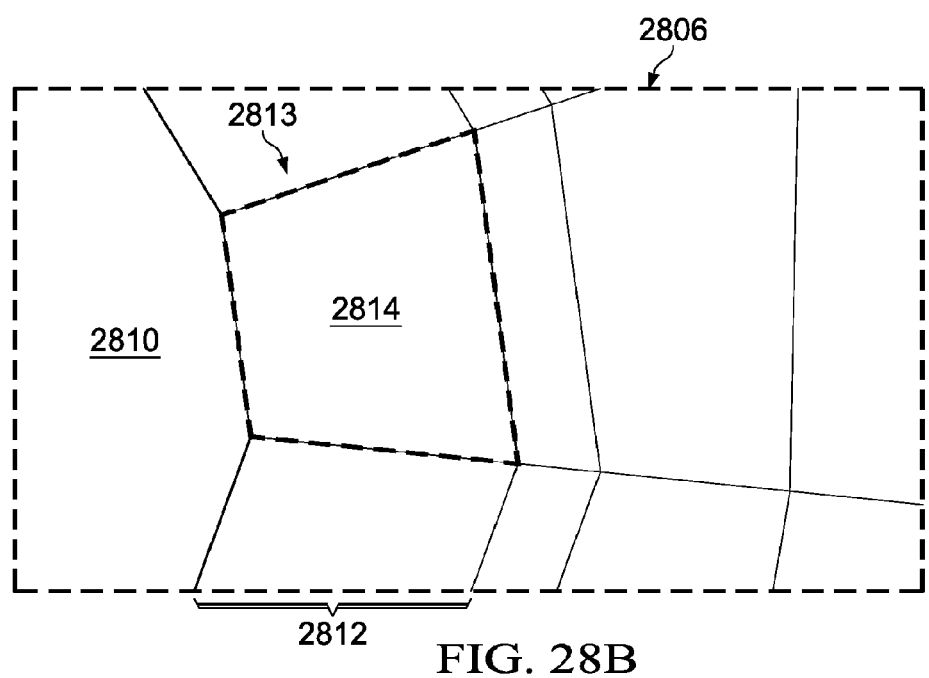

With reference now to FIGS. 28A and 28B, illustrations of a mesh having a first level of detail are depicted in accordance with an illustrative embodiment. In this illustrative example, mesh 2800 is an example of one type of mesh that may be generated based on a two-dimensional model, such as two-dimensional model 212 in FIG. 2. Mesh 2800 may be an example of one implementation for mesh 214 in FIG. 2. In this illustrative example, mesh 2800 may be a two-dimensional mesh for a joint, such as joint 201 in FIG. 2.

As depicted, mesh 2800 has plurality of holes 2802. Mesh 2800 may have first level of detail 2804 around plurality of holes 2802. First level of detail 2804 may refer to the level of detail contained in the one or more rows around plurality of holes 2802.

For example, enlarged portion 2806 is an enlargement of portion 2808 of mesh 2800 around hole 2810. Row 2812 is the row immediately adjacent to hole 2810. In these illustrative examples, the row immediately adjacent to a hole, such as hole 2810, may be referred to as the circumferential row around the hole. Row 2812 may include elements 2813. Elements 2813 may be quadrilateral shapes in this illustrative example. Element 2814 is an example of one of elements 2813 in row 2812.

Figure 29A:
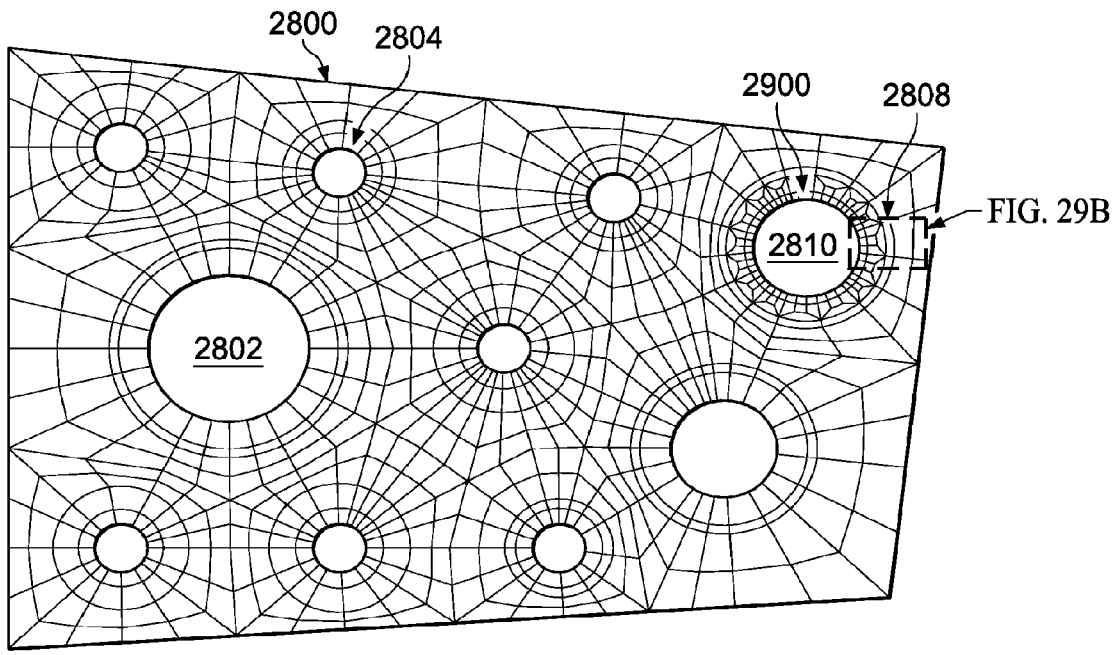
FIGS. 29A and 29B are an illustration of a mesh having a second level of detail in accordance with an illustrative embodiment.
Figure 29B:
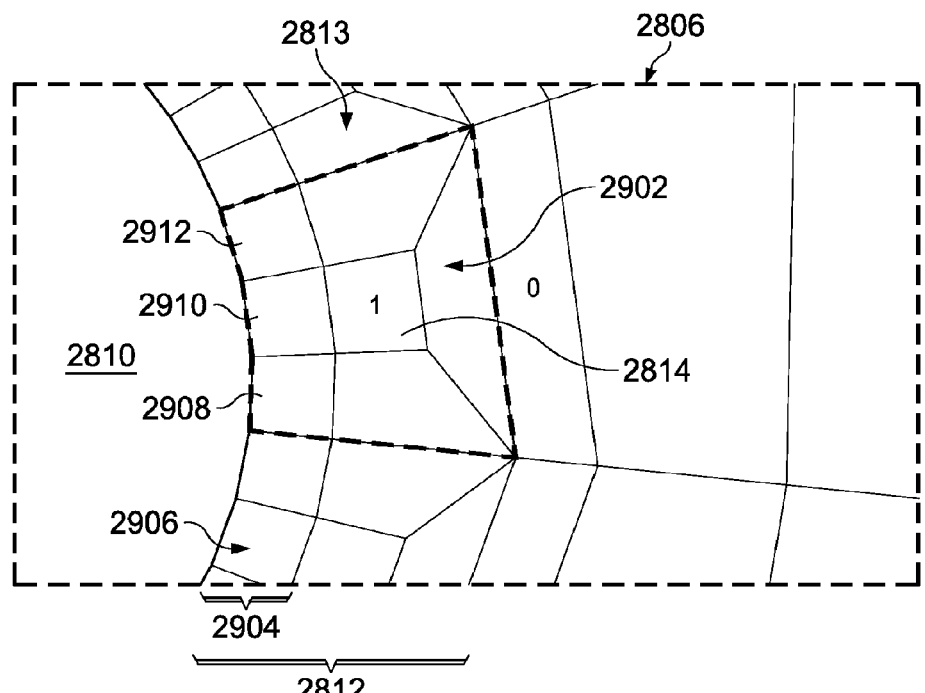

With reference now to FIGS. 29A and 29B, illustrations of a mesh having a second level of detail are depicted in accordance with an illustrative embodiment. In this illustrative example, mesh 2800 from FIG. 28A is depicted having second level of detail 2900 around hole 2810.

Second level of detail 2900 may be achieved by dividing each of elements 2813 in row 2812 FIG. 28B around hole 2810 into smaller elements based on some selected pattern. These smaller elements may also be quadrilateral shapes. For example, as depicted, element 2814 from FIG. 28B has been divided into plurality of elements 2902.

With second level of detail 2900, row 2904 is now the row immediately adjacent to hole 2810. Row 2904 includes elements 2906. Each of elements 2906 may be further divided into smaller elements to provide a third level of detail. Elements 2908, 2910, and 2912 are examples of some of elements 2906 in row 2904.

Second level of detail 2900 may allow a more detailed analysis of the portion of a structure, represented by mesh 2800, around a hole in the structure, represented by hole 2810 in mesh 2800, as compared to first level of detail 2804.

Figure 30A:
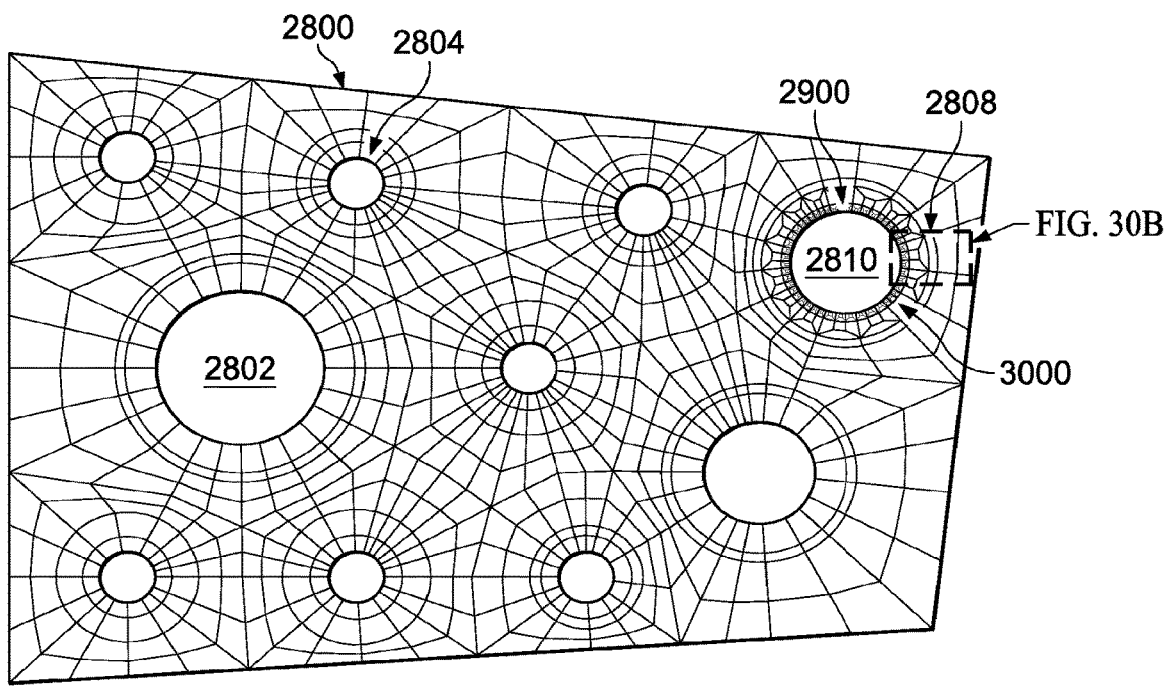
FIGS. 30A and 30B are an illustration of a mesh having a third level of detail in accordance with an illustrative embodiment.
Figure 30B:
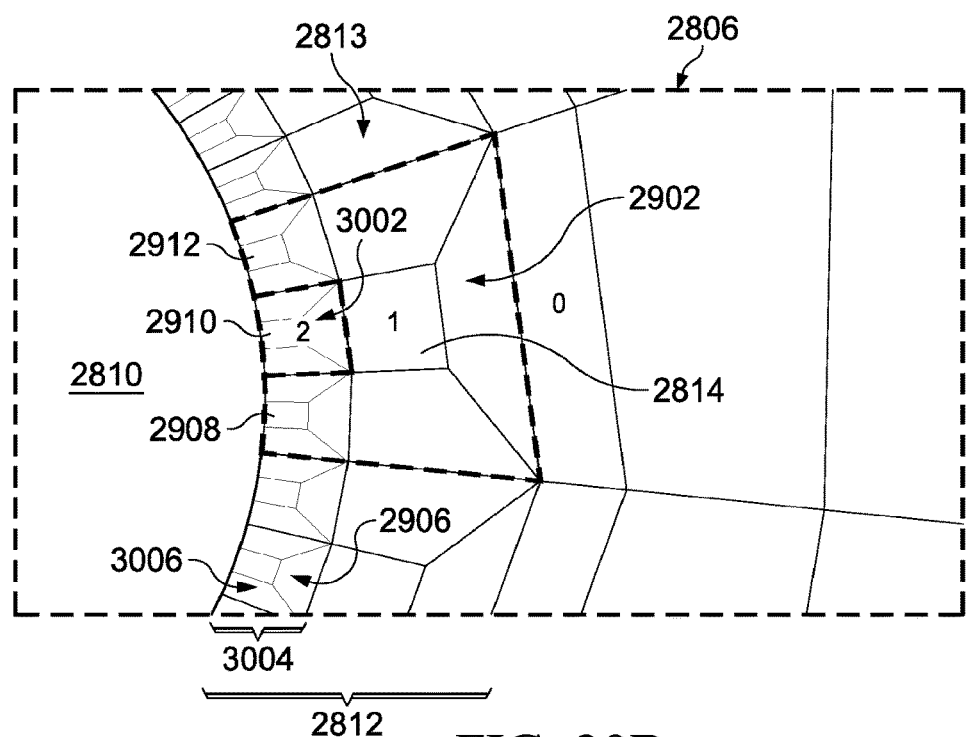

With reference now to FIGS. 30A and 30B, illustrations of a mesh having a second level of detail are depicted in accordance with an illustrative embodiment. In this illustrative example, mesh 2800 from FIG. 29A is depicted having third level of detail 3000 around hole 2810.

Third level of detail 3000 may be achieved by dividing each of elements 2906 in row 2904 in FIG. 29 around hole 2810 into smaller elements based on some selected pattern. These smaller elements may also be quadrilateral shapes. For example, as depicted, element 2910 from FIG. 29 has been divided into plurality of elements 3002.

With second level of detail 3000, row 3004 is now the row immediately adjacent to hole 2810. Row 3004 includes elements 3006. Each of elements 3006 may be further divided into smaller elements to provide yet a finer level of detail.

In this manner, any element of mesh 2800 in FIGS. 28-30 may be further divided based on a selected pattern to provide a finer level of detail. This division may be possible because mesh 2800 was generated based on a two-dimensional model, such as two-dimensional model 212 in FIG. 2, comprised entirely of triangular sectors. These triangular sectors may have the same or different shapes and the same or different sizes. In particular, the selected pattern used for increasing the level of detail for an element in mesh 2800 may be repeatable for every element of mesh.

Depending on the implementation, the method of increasing the level of detail around a hole may be applied to only a portion of the circumference around a hole instead of the entire circumference around the hole. For example, in some cases, second level of detail 2900 shown in FIG. 29B may only be applied to a first selected portion of row 2812 around hole 2810 in FIGS. 28-29. Thereafter, third level of detail 3000 may only be applied to a second selected portion of row 2904 around hole 2810 in FIGS. 29-30. In this manner, each succeeding level of increased detail may be applied to only a portion of the circumferential row around a hole, with each increasing level of detail being applied to a smaller portion of the circumferential row around the hole as compared to the preceding level of detail.

This repeatability may reduce the processing resources needed to perform analysis of the joint represented by mesh. For example, the programming complexity needed to perform the analysis may be reduced. Further, this repeatability may allow different portions of mesh 2800 to be analyzed with a finer level of detail as compared to other portions of mesh 2800, which may also reduce the overall time needed to perform analysis. These time savings may in turn, reduce the time needed to make changes to the design of the joint, manufacture the joint, repair the joint, or perform other types of operations for the joint.

For example, the repeatability of mesh 2800 may reduce the time needed to make decisions about the repair or replacement of a single fastener device. Further, different types of fastener devices may be more quickly evaluated for replacing the single fastener device.

Figure 31:
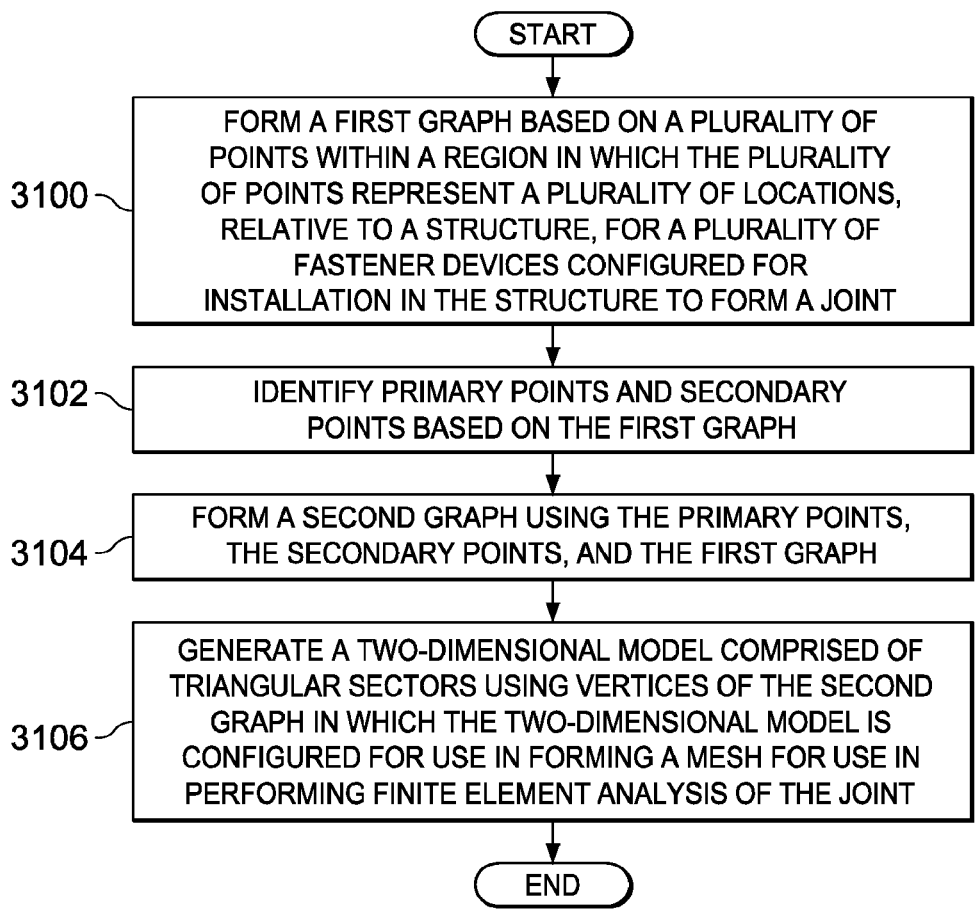
FIG. 31 is an illustration of a process for generating a two-dimensional model for use in forming a mesh for performing finite element analysis in the form of a flowchart in accordance with an illustrative embodiment.

With reference now to FIG. 31, an illustration of a process for generating a two-dimensional model for use in forming a mesh for performing finite element analysis is depicted in the form of a flowchart in accordance with an illustrative embodiment. The process illustrated in FIG. 31 may be implemented using modeler 206 in FIG. 2.

The process may begin by forming a first graph based on a plurality of points within a region in which the plurality of points represent a plurality of locations, relative to a structure, for a plurality of fastener devices configured for installation in the structure to form a joint (operation 3100). Next, primary points and secondary points are identified based on the first graph (operation 3102). Thereafter, a second graph is formed using the primary points, the secondary points, and the first graph (operation 3104).

A two-dimensional model comprised of triangular sectors is generated using vertices of the second graph in which the two-dimensional model is configured for use in forming a mesh for use in performing finite element analysis of the joint (operation 3106), with the process terminating thereafter.

Figure 32:
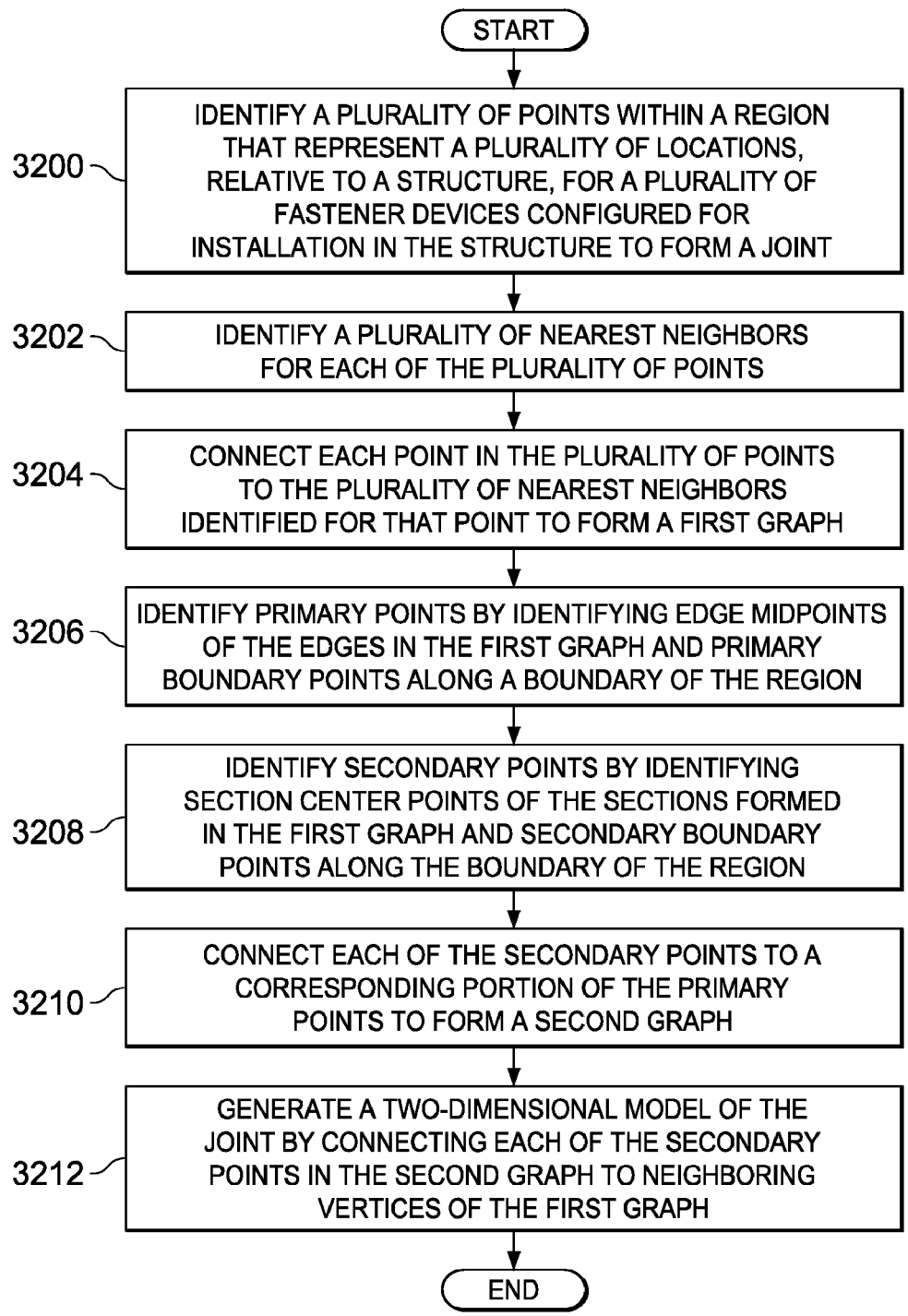
FIG. 32 is an illustration of a process for forming a two-dimensional model for a joint in the form of a flowchart in accordance with an illustrative embodiment.

With reference now to FIG. 32, an illustration of a process for forming a two-dimensional model for a joint is depicted in the form of a flowchart in accordance with an illustrative embodiment. The process illustrated in FIG. 32 may be implemented using modeler 206 in FIG. 2.

The process may begin by identifying a plurality of points within a region that represent a plurality of locations, relative to a structure, for a plurality of fastener devices configured for installation in the structure to form a joint (operation 3200). Next, a plurality of nearest neighbors is identified for each of the plurality of points (operation 3202).

Each point in the plurality of points is connected to the plurality of nearest neighbors identified for that point to form a first graph (operation 3204). In operation 3204, each connection between two points in the plurality of points is an edge in the first graph. The edges formed in operation 3204 form sections in the first graph.

Thereafter, primary points are identified by identifying edge midpoints of the edges in the first graph and primary boundary points along a boundary of the region (operation 3206). Next, secondary points are identified by identifying section center points of the sections formed in the first graph and secondary boundary points along the boundary of the region (operation 3208).

Then, each of the secondary points is connected to a corresponding portion of the primary points to form a second graph (operation 3210). A two-dimensional model of the joint is generated by connecting each of the secondary points in the second graph to neighboring vertices of the first graph (operation 3212), with the process terminating thereafter.

In operation 3212, connecting each of the secondary points in the second graph to the neighboring vertices of the first graph forms triangular sectors. Each of the triangular sectors includes a first vertex that coincides with one of the plurality of points in the region, a second vertex that coincides with one of the primary points, and a third vertex that coincides with one of the secondary points.

Figure 33:
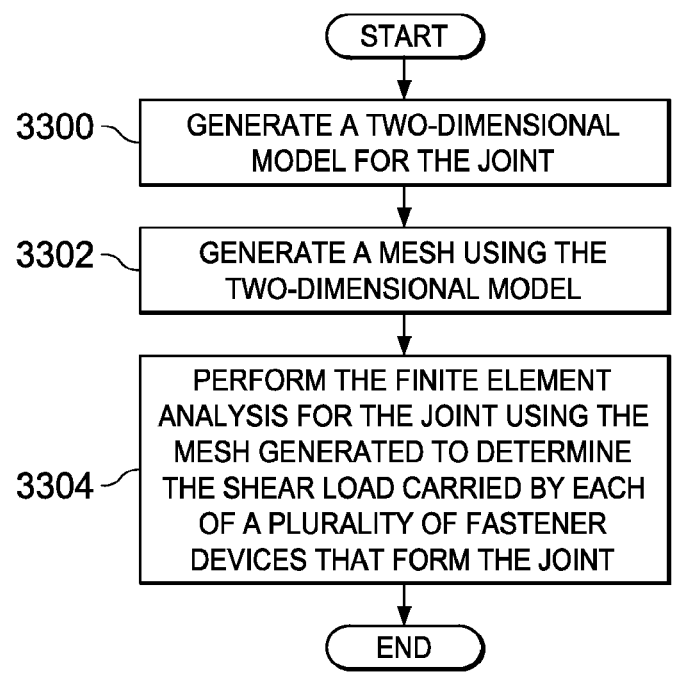
FIG. 33 is an illustration of a process for performing a finite element analysis for a joint in the form of a flowchart in accordance with an illustrative embodiment.

With reference now to FIG. 33, an illustration of a process for performing a finite element analysis for a joint is depicted in the form of a flowchart in accordance with an illustrative embodiment. The process illustrated in FIG. 33 may be used to calculate the shear load carried by each fastener device that forms the joint.

The process may begin by generating a two-dimensional model for the joint (operation 3300). Operation 3300 may be implemented using the process described above in FIG. 31 or in FIG. 32. Next, a mesh is generated using the two-dimensional model (operation 3302). In operation 3302, the mesh may be a two-dimensional mesh or a three-dimensional mesh. Further, in operation 3302, each triangular sector of the two-dimensional model may be divided into a plurality of elements based on a selected pattern to generate a two-dimensional mesh. The plurality of elements may be quadrilateral shapes. In another illustrative example, different portions of each triangular sector in the two-dimensional model may be used as solids of revolution to form a plurality of solid elements based on a selected pattern to generate a three-dimensional mesh. The plurality of solid elements may be hexahedral shapes.

Thereafter, the finite element analysis for the joint may be performed using the mesh generated to determine the shear load carried by each of a plurality of fastener devices that form the joint (operation 3304), with the process terminating thereafter. In other words, in operation 3304, the finite element analysis may be performed to determine the load share of the plurality of fastener devices. A result of the finite element analysis performed in operation 3304 may be used to control the design of the joint, the manufacturing of the joint, the maintenance of the joint, or some combination thereof.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, a portion of an operation or step, some combination thereof.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Turning now to FIG. 34, an illustration of a data processing system is depicted in the form of a block diagram in accordance with an illustrative embodiment. A data processing system similar to data processing system 3400 may be used to implement computer system 205 in FIG. 2. In one illustrative example, a data processing system similar to data processing system 3400 may be used to implement modeler 206, mesh generator 208, analyzer 210, or some combination thereof. In some cases, a data processing system similar to data processing system 3400 may be used to implement graph generator 220, model generator 224, or both.

As depicted, data processing system 3400 includes communications framework 3402, which provides communications between processor unit 3404, storage devices 3406, communications unit 3408, input/output unit 3410, and display 3412. In some cases, communications framework 3402 may be implemented as a bus system.

Processor unit 3404 is configured to execute instructions for software to perform a number of operations. Processor unit 3404 may comprise at least one of a number of processors, a multi-processor core, or some other type of processor, depending on the implementation. In some cases, processor unit 3404 may take the form of a hardware unit, such as a circuit system, an application specific integrated circuit (ASIC), a programmable logic device, or some other suitable type of hardware unit.

As used herein, the phrase "at least one of," when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required.

For example, "at least one of item A, item B, and item C" may mean item A; item A and item B; item B; item A, item B, and item C; item A and item C; or item B and item C. In some cases, "at least one of item A, item B, and item C" may mean, for example, without limitation, two of item A, one of item B, and ten of item C; four of item B and seven of item C; or some other suitable combination.

Instructions for the operating system, applications and programs run by processor unit 3404 may be located in storage devices 3406. Storage devices 3406 may be in communication with processor unit 3404 through communications framework 3402. As used herein, a storage device, also referred to as a computer readable storage device, is any piece of hardware capable of storing information on a temporary basis, a permanent basis, or both. This information may include, but is not limited to, data, program code, other information, or some combination thereof.

Memory 3414 and persistent storage 3416 are examples of storage devices 3406. Memory 3414 may take the form of, for example, a random access memory or some type of volatile or non-volatile storage device. Persistent storage 3416 may comprise any number of components or devices. For example, persistent storage 3416 may comprise a hard drive, a flash memory, a rewritable optical disk, a rewritable magnetic tape, or some combination of the above. The media used by persistent storage 3416 may or may not be removable.

Communications unit 3408 allows data processing system 3400 to communicate with other data processing systems, devices, or both. Communications unit 3408 may provide communications using physical communications links, wireless communications links, or both.

Input/output unit 3410 allows input to be received from and output to be sent to other devices connected to data processing system 3400. For example, input/output unit 3410 may allow user input to be received through a keyboard, a mouse, some other type of input device, or a combination thereof. As another example, input/output unit 3410 may allow output to be sent to a printer connected to data processing system 3400.

Display 3412 is configured to display information to a user. Display 3412 may comprise, for example, without limitation, a monitor, a touch screen, a laser display, a holographic display, a virtual display device, some other type of display device, or a combination thereof.

In this illustrative example, the processes of the different illustrative embodiments may be performed by processor unit 3404 using computer-implemented instructions. These instructions may be referred to as program code, computer usable program code, or computer readable program code and may be read and executed by one or more processors in processor unit 3404.

In these examples, program code 3418 is located in a functional form on computer readable media 3420, which is selectively removable, and may be loaded onto or transferred to data processing system 3400 for execution by processor unit 3404. Program code 3418 and computer readable media 3420 together form computer program product 3422. In this illustrative example, computer readable media 3420 may be computer readable storage media 3424 or computer readable signal media 3426.

Computer readable storage media 3424 is a physical or tangible storage device used to store program code 3418 rather than a medium that propagates or transmits program code 3418. Computer readable storage media 3424 may be, for example, without limitation, an optical or magnetic disk or a persistent storage device that is connected to data processing system 3400.

Alternatively, program code 3418 may be transferred to data processing system 3400 using computer readable signal media 3426. Computer readable signal media 3426 may be, for example, a propagated data signal containing program code 3418. This data signal may be an electromagnetic signal, an optical signal, or some other type of signal that can be transmitted over physical communications links, wireless communications links, or both.

The illustration of data processing system 3400 in FIG. 34 is not meant to provide architectural limitations to the manner in which the illustrative embodiments may be implemented. The different illustrative embodiments may be implemented in a data processing system that includes components in addition to or in place of those illustrated for data processing system 3400. Further, components shown in FIG. 34 may be varied from the illustrative examples shown.

Illustrative embodiments of the disclosure may be described in the context of aircraft manufacturing and service method 3500 as shown in FIG. 35 and aircraft 3600 as shown in FIG. 36. Turning first to FIG. 35, an illustration of an aircraft manufacturing and service method is depicted in the form of a block diagram in accordance with an illustrative embodiment. During pre-production, aircraft manufacturing and service method 3500 may include specification and design 3502 of aircraft 3600 in FIG. 36 and material procurement 3504.

During production, component and subassembly manufacturing 3506 and system integration 3508 of aircraft 3600 in FIG. 36 takes place. Thereafter, aircraft 3600 in FIG. 36 may go through certification and delivery 3510 in order to be placed in service 3512. While in service 3512 by a customer, aircraft 3600 in FIG. 36 is scheduled for routine maintenance and service 3514, which may include modification, reconfiguration, refurbishment, and other maintenance or service.

Each of the processes of aircraft manufacturing and service method 3500 may be performed or carried out by at least one of a system integrator, a third party, or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 36, an illustration of an aircraft is depicted in the form of a block diagram in which an illustrative embodiment may be implemented. In this example, aircraft 3600 is produced by aircraft manufacturing and service method 3500 in FIG. 35 and may include airframe 3602 with plurality of systems 3604 and interior 3606. Examples of systems 3604 include one or more of propulsion system 3608, electrical system 3610, hydraulic system 3612, and environmental system 3614. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 3500 in FIG. 35. In particular, finite element analysis system 200 from FIG. 2 may be used to perform finite element analysis 216 for any part or component for aircraft 3600 during any one of the stages of aircraft manufacturing and service method 3500. For example, without limitation, finite element analysis system 200 from FIG. 2 may be used to perform finite element analysis 216 during at least one of specification and design 3502, material procurement 3504, component and subassembly manufacturing 3506, system integration 3508, routine maintenance and service 3514, or some other stage of aircraft manufacturing and service method 3500.

In one illustrative example, components or subassemblies produced in component and subassembly manufacturing 3506 in FIG. 35 may be fabricated or manufactured in a manner similar to components or subassemblies produced while aircraft 3600 is in service 3512 in FIG. 35. As yet another example, one or more apparatus embodiments, method embodiments, or a combination thereof may be utilized during production stages, such as component and subassembly manufacturing 3506 and system integration 3508 in FIG. 35. One or more apparatus embodiments, method embodiments, or a combination thereof may be utilized while aircraft 3600 is in service 3512, during maintenance and service 3514 in FIG. 35, or both. The use of a number of the different illustrative embodiments may substantially expedite the assembly of and reduce the cost of aircraft 3600.

Figure 37:
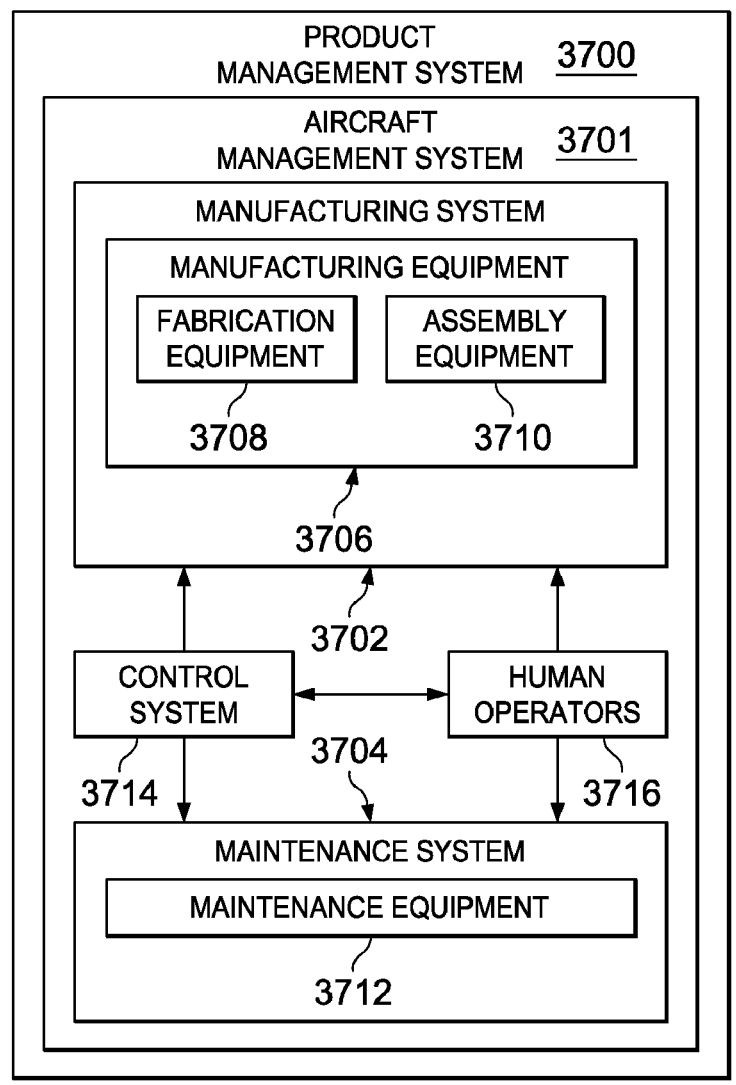
FIG. 37 is an illustration of a management system in the form of a block diagram in accordance with an illustrative embodiment.

Turning now to FIG. 37, an illustration of a management system is depicted in the form of a block diagram in accordance with an illustrative embodiment. Product management system 3700 is a physical hardware system. In this illustrative example, product management system 3700 may include at least one of manufacturing system 3702 or maintenance system 3704.

Manufacturing system 3702 is configured to manufacture products, such as, for example, without limitation, aircraft 3600 in FIG. 36. When manufacturing system 3702 is used to manufacture aircraft, such as aircraft 3600 FIG. 36, product management system 3700 may be referred to as aircraft management system 3701.

As depicted, manufacturing system 3702 includes manufacturing equipment 3706. Manufacturing equipment 3706 may include at least one of fabrication equipment 3708 or assembly equipment 3710.

Fabrication equipment 3708 is equipment that may be used to fabricate components for parts used to form, for example, aircraft 3600. For example, fabrication equipment 3708 may include machines and tools. These machines and tools may include at least one of a drill, a hydraulic press, a furnace, a mold, a composite tape laying machine, a vacuum system, a lathe, or other types of machines or tools. Fabrication equipment 3708 may be used to fabricate at least one of metal parts, composite parts, semiconductors, circuits, fasteners, ribs, skin panels, spars, antennas, or other suitable types of parts.

Assembly equipment 3710 is equipment used to assemble parts to form aircraft 3600. In particular, assembly equipment 3710 may be used to assemble components and parts to form aircraft 3600. Assembly equipment 3710 also may include machines and tools. These machines and tools may include at least one of a robotic arm, a crawler, a faster installation system, a rail-based drilling system, or other types of machines or tools. Assembly equipment 3710 may be used to assemble parts, such as, for example, without limitation, seats, horizontal stabilizers, wings, engines, engine housings, landing gear systems, and other parts for aircraft 3600.

In this illustrative example, maintenance system 3704 includes maintenance equipment 3712. Maintenance equipment 3712 may include any equipment needed to perform maintenance on a product, such as, for example, aircraft 3600. This maintenance may include performing different operations on parts on aircraft 3600 to perform routine maintenance, inspections, upgrades, refurbishment, other types of maintenance operations, or some combination thereof. As one illustrative example, maintenance equipment 3712 may be used to perform operations such as, but not limited to, at least one of disassembling parts, refurbishing parts, inspecting parts, reworking parts, manufacturing placement parts, or some other type of maintenance operation.

In one illustrative example, maintenance equipment 3712 may include ultrasonic inspection devices, x-ray imaging systems, vision systems, drills, crawlers, and other suitable device. In some cases, maintenance equipment 3712 may include fabrication equipment 3708, assembly equipment 3710, or both to produce and assemble parts that may be needed for maintenance.

Product management system 3700 also includes control system 3714. Control system 3714 is a hardware system and may also include software or other types of components. Control system 3714 is configured to control the operation of at least one of manufacturing system 3702 or maintenance system 3704. In particular, control system 3714 may control the operation of at least one of fabrication equipment 3708, assembly equipment 3710, or maintenance equipment 3712.

The hardware in control system 3714 may include, for example, without limitation, computers, circuits, networks, and other types of hardware equipment. In some cases, the control of manufacturing system 3702, maintenance system 3704, or both may take the form of direct control.

For example, robots, computer-controlled machines, and other equipment in manufacturing equipment 3706 may be directly controlled by control system 3714. In other illustrative examples, control system 3714 may be used to manage operations performed by human operators 3716 during the manufacturing or maintenance of aircraft 3600.

For example, human operators 3716 may operate or interact with at least one of manufacturing equipment 3706, maintenance equipment 3712, or control system 3714.

In these illustrative examples, finite element analysis system 200 from FIG. 2 may be implemented in control system 3714 to manage at least one of the manufacturing or maintenance of aircraft 3600 in FIG. 36. For example, finite element analysis system 200 may be used to perform finite element analysis 216 in FIG. 2 for a joint in aircraft 3600. The joint may be a joint that is to be manufactured using manufacturing system 3702 or a joint on which maintenance operations are to be performed using maintenance system 3704.

In one illustrative example, modeler 206 in FIG. 2 may be used to generate two-dimensional model 212 for the joint. Mesh generator 208 may be used to generate mesh 214 for the joint based on two-dimensional model 212. Analyzer 210 may then be used to perform finite element analysis 216 using mesh 214. The results of finite element analysis 216 may be used to make at least one of decisions about or changes to the design of the joint prior to the manufacturing of the joint, changes to the manufacturing process to be used for the joint, changes to the types of fastener devices to be used for the joint, changes to the maintenance operations to be performed on the joint, other types of decisions, or other types of changes.

Although product management system 3700 has been described with respect to manufacturing in the aerospace industry, product management system 3700 may be configured to manage products for other industries. For example, product management system 3700 may be configured to manufacture products for the automotive industry as well as any other suitable industries. Further, in other illustrative examples, product management system 3700 may be configured to manage other products other than aircraft 3600. For example, product management system 3700 may be configured to manage products, such as watercraft, spacecraft, buildings, equipment, and other types of products.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
   a graph generator,
      wherein the graph generator is configured to form a first graph based on a plurality of points within a region in which the plurality of points represent a plurality of locations relative to a structure for a plurality of fastener devices configured to be installed in the structure to form a joint;
      wherein the graph generator is configured to identify primary points and secondary points based on the first graph and to form a second graph using the primary points, the secondary points, and the first graph; and
   a model generator configured to generate a two-dimensional model consisting entirely of triangular sectors using vertices of the second graph, wherein the two-dimensional model is configured for use in forming a mesh for use in performing finite element analysis for the joint, and wherein a mesh size within each triangular sector increases from a hole zone of the each triangular sectors to a circular zone of the each triangular sectors to a transition zone of the each triangular sectors; and
   a processor configured to perform the finite element analysis for the joint.

2. The apparatus of claim 1, wherein the graph generator is configured to identify a plurality of nearest neighbors for each of the plurality of points and to form the first graph based on the plurality of nearest neighbors identified for each point in the plurality of points.

3. The apparatus of claim 2, wherein the graph generator is configured to connect a point in the plurality of points to the plurality of nearest neighbors for the point to form a portion of edges in the first graph.

4. The apparatus of claim 1, wherein the primary points identified by the graph generator include edge midpoints of edges in the first graph and primary boundary points along a boundary of the region.

5. The apparatus of claim 4, wherein the secondary points identified by the graph generator include section center points of sections formed by the first graph and secondary boundary points along the boundary of the region.

6. The apparatus of claim 5, wherein the graph generator is configured to connect each of the secondary points to a corresponding portion of the primary points to form the second graph.

7. The apparatus of claim 1, wherein the model generator is configured to connect each of the secondary points in the second graph to neighboring vertices of the first graph to form the triangular sectors.

8. The apparatus of claim 1, wherein each of the triangular sectors includes a first vertex that coincides with one of the plurality of points, a second vertex that coincides with one of the primary points, and a third vertex that coincides with one of the secondary points.

9. The apparatus of claim 1 further comprising:
   a mesh generator configured to generate the mesh based on the two-dimensional model in which a mesh pattern used to generate the mesh is repeatable for each of the triangular sectors, wherein the mesh is one of a two-dimensional mesh and a three-dimensional mesh.

10. A computer-implemented method for analyzing a joint, the method comprising:
    forming a first graph based on a plurality of points within a region in which the plurality of points represent a plurality of fastener devices that comprise the joint;
    identifying primary points and secondary points based on the first graph;
    forming a second graph using the primary points, the secondary points, and the first graph;
    generating a two-dimensional model comprised of triangular sectors using vertices of the second graph;
    generating a mesh comprised of elements using the two-dimensional model;
    increasing a level of detail of a selected portion of the mesh to a next level of detail by applying a same selected pattern to each of a number of elements in the selected portion of the mesh;
    performing finite element analysis of the joint using the mesh; and controlling at least one of a design, manufacturing, or maintenance of the joint based on a result of the finite element analysis, and wherein:

the hole zone corresponds to a first portion of a triangular sector that overlaps with a hole through the structure being modeled;

the circular zone corresponds to a second portion of the triangular sector that overlaps with a part of the structure located around a fastener device; and the transition zone corresponds to a third portion of the triangular sector that overlaps with areas of the structure outsize the hole zone and the circular zone.

11. The computer-implemented method of claim 10 further comprising:

increasing the next level of detail of a new selected portion of the mesh to another next level of detail by applying the selected pattern to the each of the number of elements in the new selected portion of the mesh.

12. The apparatus of claim 10 wherein the apparatus further comprises:

a display device configured to display the mesh.

* * * * *

UNITED STATES PATENT AND TRADEMARK OFFICE
CERTIFICATE OF CORRECTION

PATENT NO. : 10,026,225 B2
APPLICATION NO. : 15/641172
DATED : July 17, 2018
INVENTOR(S) : Grip It is certified that error appears in the above-identified patent and that said Letters Patent is hereby corrected as shown below:

In the Claims

Column 31, Line 4, change "the hole zone" to --a hole zone--
Column 31, Line 5, change "the structure" to --a structure--
Column 31, Line 7, change "the circular zone" to --a circular zone--
Column 31, Line 10, change "the transition zone" to --a transition zone--
Column 31, Line 19, change "The apparatus of claim 10" to --The computer-implemented method of claim 10--

Signed and Sealed this
Thirtieth Day of October, 2018

Andrei Iancu
*Director of the United States Patent and Trademark Office*